(12) United States Patent
Howlett et al.

(10) Patent No.: US 12,549,147 B2
(45) Date of Patent: Feb. 10, 2026

(54) CIRCUITRY FOR AND METHODS OF GAIN CONTROL

(71) Applicant: Cirrus Logic International Semiconductor Ltd., Edinburgh (GB)

(72) Inventors: Andrew J. Howlett, Edinburgh (GB); Michael Chandler-Page, Chesterfield (GB); David P. Singleton, Edinburgh (GB); Erich P. Zwyssig, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 613 days.

(21) Appl. No.: 17/982,864

(22) Filed: Nov. 8, 2022

(65) Prior Publication Data

US 2023/0353111 A1 Nov. 2, 2023

Related U.S. Application Data

(60) Provisional application No. 63/406,037, filed on Sep. 13, 2022, provisional application No. 63/338,919,
(Continued)

(51) Int. Cl.
*H03G 3/30* (2006.01)
*H03F 3/04* (2006.01)
*H04R 3/04* (2006.01)

(52) U.S. Cl.
CPC ............ *H03G 3/30* (2013.01); *H03F 3/04* (2013.01); *H03G 3/3005* (2013.01); *H04R 3/04* (2013.01);
(Continued)

(58) Field of Classification Search
CPC .. H03F 3/04; H03F 2200/03; H03F 2200/451; H03F 3/181; H03F 3/189;
(Continued)

(56) References Cited

U.S. PATENT DOCUMENTS

| 5,170,359 | A | 12/1992 | Sax |
| 5,808,575 | A | 9/1998 | Himeno et al. |

(Continued)

FOREIGN PATENT DOCUMENTS

| GB | 2119189 A | 11/1983 |
| JP | 2007036377 A | 2/2007 |

OTHER PUBLICATIONS

International Search Report and Written Opinion of the International Searching Authority, International Application No. PCT/GB2023/051013, mailed Jul. 26, 2023.
(Continued)

*Primary Examiner* — Andrea Lindgren Baltzell
*Assistant Examiner* — Khiem D Nguyen
(74) *Attorney, Agent, or Firm* — Jackson Walker L.L.P.

(57) ABSTRACT

An integrated circuit (IC), comprising: a first input pin for receiving a first input signal; a first converter configured to convert the first input signal to a first output signal; a first gain stage configured to apply a first gain to the first output signal; gain update circuitry configured to: output a first external gain control signal to a first output pin of the IC; and subsequently output a first internal gain control signal to the first gain stage to update the first gain of the first gain stage, wherein output of the first internal gain control signal is delayed relative to output of the first external gain control signal by a first predetermined delay, the first predetermined delay to compensate for signal chain delay between the first input pin and the first gain stage.

18 Claims, 19 Drawing Sheets

Related U.S. Application Data filed on May 6, 2022, provisional application No. 63/335,767, filed on Apr. 28, 2022.

(52) U.S. Cl.
CPC ... *H03G 2201/103* (2013.01); *H04R 2430/01* (2013.01)

(58) Field of Classification Search
CPC .. H03G 3/30; H03G 3/3005; H03G 2201/103; H03G 3/3089; H03G 3/3042; H03M 1/188; H04R 3/04; H04R 2430/01; H04R 3/00
USPC ...................................... 330/278, 124 R, 295
See application file for complete search history.

(56) References Cited

U.S. PATENT DOCUMENTS

| | | | |
|---|---|---|---|
| 5,838,269 | A | 11/1998 | Xie |
| 8,032,097 | B2 | 10/2011 | Drogi |
| 8,428,536 | B2 * | 4/2013 | Khoini-Poorfard ...... H04B 1/28 375/345 |
| 9,596,537 | B2 | 3/2017 | He et al. |
| 9,998,823 | B2 | 6/2018 | He et al. |
| 10,785,568 | B2 | 9/2020 | Das et al. |
| 11,699,423 | B1 | 7/2023 | Chiu |
| 2009/0175468 | A1 | 7/2009 | Cheng et al. |
| 2011/0234438 | A1 | 9/2011 | Daishoji |
| 2012/0188111 | A1 | 7/2012 | Ledzius et al. |
| 2013/0080097 | A1 | 3/2013 | Yogeeswaran |
| 2021/0409034 | A1 | 12/2021 | Thiagarajan |
| 2022/0225025 | A1 | 7/2022 | Hasegawa |
| 2023/0353937 | A1 | 11/2023 | Howlett et al. |
| 2024/0154592 | A1 | 5/2024 | Howlett et al. |
| 2025/0274092 | A1 | 8/2025 | Howlett et al. |

OTHER PUBLICATIONS

International Search Report and Written Opinion of the International Searching Authority, International Application No. PCT/GB2025/051030, mailed Nov. 12, 2025.

Texas Instruments, TAS5760M General-Purpose I2S Input Class-D Amplifier, Dec. 31, 2020.

\* cited by examiner

CIRCUITRY FOR AND METHODS OF GAIN CONTROL

TECHNICAL FIELD

The present disclosure relates to an apparatus, systems and methods of gain control.

BACKGROUND

Gain control circuits are widely-used to vary the gain of signals from various sources. Such gain control circuits may be implemented as part of a signal chain which may include a converter, such as an analog-to-digital converter (ADC), to convert an analog input signal to a digital output signal. Such an implementation can be found, for example, in a typical audio mixing desk, to control the volume level of a signal received from an analog source (e.g., a microphone or other line-in port).

Traditionally, gain control is implemented using an analog potentiometer to continuously vary a resistance in the signal chain to adjust the signal level of the output signal. An analog potentiometer cannot easily be controlled by digital means and therefore cannot easily be integrated into a digital audio processing system (such as a digital mixing console). Where digital control of gain is required, a combination of discrete resistors and switches may be implemented to adjust the resistance of a signal chain in low-resolution step changes based on digital control of the switches. Such gain control is typically combined with fine-resolution gain control in a digital audio processing system, which is used to allow fine tuning of gain between each of the low-resolution steps. A challenge in such systems is the ability to synchronise updates in the low- and high-resolution gain applied to an input signal.

SUMMARY

According to a first aspect of the disclosure, there an integrated circuit (IC), comprising: a first input pin for receiving a first input signal; a first converter configured to convert the first input signal to a first output signal; a first gain stage configured to apply a first gain to the first output signal to generate a first amplified output signal; gain update circuitry configured to: output a first external gain control signal to a first output pin of the IC; and subsequently output a first internal gain control signal to the first gain stage to update the first gain of the first gain stage, wherein output of the first internal gain control signal is delayed relative to output of the first external gain control signal by a first predetermined delay, the first predetermined delay to compensate for signal chain delay between the first input pin and the first gain stage.

The gain update circuitry may be further configured to: monitor the first input signal or the first output signal for a signal event at which to update the first gain of the first gain stage; and time-align output of the first internal gain control signal to temporally coincide with the signal event reaching the first gain stage.

The signal event may comprise a zero-crossing of the first input signal or the first output signal. The gain update circuitry may comprise zero-cross detection circuitry configured to monitor the first input signal or the first output signal for the zero-crossing.

The gain update circuitry is configured to: receive a first signal event flag at a signal event input pin of the IC; and time output of the internal gain control signal based on a time at which the signal event flag is received. The first signal event flag may signify a zero-crossing in the first input signal. The gain updated circuitry may comprise level detection circuitry configured to process the received first signal event flag. The level detection circuitry may comprise a flash analog-to-digital converter (ADC).

The converter may comprise an analog-to-digital converter.

The IC may further comprise filter circuitry provided between the first input pin and the converter, the filter circuitry configured to filter the first input signal to be provided to the converter. The filter circuitry may contribute to the signal chain delay. The filter circuitry may be configured to low-pass filter the first input signal. The filter circuitry may be configured to impedance match the first input signal to an input impedance of the converter. The first input signal may be an audio signal.

The IC may further comprise an interface for receiving first gain settings from a host device; one or more registers for storing the first gain settings. The gain update circuitry may be configured to: read the first gain settings from the one or more registers; and generate the first external gain control signal and/or the first internal gain control signal based on the first gain settings.

The first gain setting may comprise a first external gain setting and a first internal gain setting. The first internal and first external gain settings may be stored in separate ones of the one or more registers. The first external and internal gain settings may be treated atomically by the gain control circuitry. For example, the gain control circuitry may be configured to copy or read the first external and internal gain settings if an update flag in the one or more registers is flagged, indicating that the first external and internal gain settings have been updated.

The IC may be configured to receive and process the first gain settings at the interface asynchronously to output of the first external gain control signal and the first internal gain control signal.

The gain update circuitry may be configured to: determine whether the first gain setting is within a dynamic range of the first gain of the first gain stage; if the first gain setting is within the dynamic range of the first gain of the first gain stage, update the first internal gain control signal based on the first gain setting; and if the first gain setting is outside the dynamic range of the first gain of the first gain stage, update the first internal gain control signal and the first external gain control signal.

The interface may be a serial interface.

The IC may further comprise: a second input pin for receiving a second input signal; a second converter configured to convert the second input signal to a second output signal; a second gain stage configured to apply a second gain to the second output signal. The gain update circuitry may be configured to: output a second external gain control signal to a second output pin of the IC; and subsequently output a second internal gain control signal to the second gain stage to update the second gain of the second gain stage, wherein output of the second internal gain control signal is delayed relative to output of the second external gain control signal by a second predetermined delay, the second predetermined delay to compensate for signal chain delay between the second input pin and the second gain stage.

The first converter may be configured to: receive an indication of a temporal location of a transient in the first input signal; and provide, in the first output signal, a masking signal bridging the temporal location of the transient to mask the transient.

The masking signal may be based on a portion of the input signal that precedes the transient.

The first converter may comprise an analog-to-digital converter, wherein the first input signal is an analog input signal, wherein the first output signal is a digital output signal comprising a stream of samples of the analog input signal. The stream of samples may comprise preceding samples that precede the transient, masking samples of the masking signal, and following samples that follow the transient, wherein the masking signal is based on the preceding samples. The masking signal may comprise a first set of successive masking samples each comprising a copy of one of the preceding samples. The masking signal may comprise a first set of successive masking samples, an amplitude of each successive masking sample of the first set changing relative to an immediately preceding masking sample of the first set by a respective first delta, each of the respective first deltas having the same signal. The respective first deltas may successively decrease through the first set of successive masking samples. A rate of change of successive first deltas may be configurable. The rate of change of successive first deltas may be configurable based on a duration of the masking signal.

An amplitude of a first masking sample of the first set may be equal to the sum of an amplitude of a first one of the preceding samples immediately preceding the first masking sample and a delta between the amplitude of the one of the preceding samples immediately preceding the first masking sample and the amplitude of a second one of the preceding samples immediately preceding the first one of the preceding samples.

The signal processing circuitry may be configured to provide in the processed output signal, in place of a plurality of the following samples, a plurality of transition samples, wherein an amplitude of each successive transition sample differs relative to an immediately preceding transition sample by a respective second delta, each of the respective second deltas having the same sign.

A rate of change of successive second deltas may be configurable, for example based on the duration of the masking signal.

The amplitude $A_T$ of each respective successive transition sample may be defined by the following equation:

$$A_T = A_{TP} + (A_{VP} - A_{TP})^*F$$

where $A_{TP}$ is an amplitude of a respective transition sample immediately preceding the respective successive transition sample, $A_{VP}$ is an amplitude of a respective following sample replaced in the processed output signal by the respective transition sample immediately preceding the respective successive masking sample, and F is a factor which successively increases for each respective successive transition sample or which successively decreases for each respective successive transition sample.

The IC may be further configured to look ahead to at least one first following sample of the following samples, wherein the masking signal may be generated based on at least one of the preceding samples and the at least one first following sample of the following samples.

Successive masking samples of the masking signal may ramp in magnitude between the last preceding sample and the first following sample to define a magnitude gradient. The amplitude gradient may be constant or vary over time.

The IC may further comprise level detection circuitry configured to detect an amplitude of the first input signal, wherein the first converter is only configured to provide the masking signal in the first output signal if the amplitude of the input signal is below an amplitude threshold. The level detection circuitry may be configured to determine a perceived signal amplitude of the first input signal; and set the amplitude threshold based on the perceived signal amplitude. The level detection circuitry may be configured to determine the perceived signal amplitude by determining a moving average of a root mean squared of an amplitude of the first input signal. The level detection circuitry may be configured to determine the perceived signal amplitude by determining an exponential moving average of a magnitude of the first input signal.

According to another aspect of the disclosure, there is provided a system comprising: a first analog input for receiving a first analog input signal; a first analog gain stage configured to apply a first analog gain to the first analog input signal to generate the first input signal; and the IC of any one of the preceding claims.

The first analog gain and the first gain may be adjustable in step changes, wherein step changes of the first analog gain are larger than step changes of the first gain.

The first analog gain stage may comprise a zero-crossing detector configured to detect a zero-crossing event in the analog input signal.

The first analog gain stage may comprise: a resistor network comprising a plurality of resistors; and a plurality of switches.

The system may further comprise external filter circuitry provided between the first analog gain stage and the IC, the external filter circuitry configured to filter the first input signal to be provided to the IC, wherein the filter circuitry contributes to the signal chain delay. The filter circuitry may be configured to low-pass filter the first input signal.

The filter circuitry may be configured to impedance match the first input signal to an input impedance of the converter.

The system may further comprise: a synchronization input pin for receiving a plurality of synchronization signals; and a synchronization interface configured to process the plurality of synchronization signals.

Each of the plurality of synchronization signals may comprise a zero-cross detection flag.

According to another aspect of the disclosure, there is provided gain control circuitry, comprising: an input for receiving an analog input signal; a first gain stage to apply a first gain to the input signal to provide an intermediate signal, the first gain stage comprising an array of resistors and analog switches; and an integrated circuit (IC) comprising: an analog-to-digital converter (ADC) configured to convert the intermediate signal into a digital signal; a second gain stage configured to apply a second gain to the digital signal to provide an amplified output signal; a synchronization module configured to generate a synchronization control signal for the first gain stage such that an update of the first gain can be synchronized with an update of the second gain to prevent artefacts in the amplified output signal.

The synchronization module may be configured to generate the synchronization control signal so as to prevent artefacts due to adjustments of the first and second gains not being coincident in time relative to the analog input signal.

According to another aspect of the disclosure, there is provided an integrated circuit (IC), comprising: an analog-to-digital converter (ADC); a gain stage; a synchronization module configured to output a synchronization signal, the IC for use in the gain control circuit described above.

According to another aspect of the disclosure, there is provided an integrated circuit (IC), comprising: a converter configured to convert an input signal to an output signal; a gain function configured to apply a gain to the output signal to provide an amplified output signal, wherein the gain function is configured to update a level of the gain in response to receipt of a first synchronization signal; and delay circuitry configured to implement a programmable time delay between receipt of the first synchronization signal and the update of the level of the gain.

The programmable time delay may be programmed to match a signal latency associated with external circuitry generating the input signal.

The IC may further comprise: memory for storing a user-definable delay value, wherein the delay circuitry is configured to set the programmable time delay based on the user-definable delay value.

The first synchronization signal may be generated on the IC or alternatively external to the IC and received at an input pin of the IC.

The IC may be configured to receive the first synchronization signal and a second synchronization signal at the input pin of the IC.

The converter may be an ADC, the output signal may be a digital signal, and the gain function may comprise a digital gain stage.

According to another aspect of the disclosure, there is provided an integrated circuit (IC), comprising: a converter configured to convert an input signal to an output signal; a gain stage configured to apply a gain to the output signal to provide an amplified output signal; and a synchronization module configured to: monitor the input signal or the output signal for a suitable time period to update the gain based on the monitored input or output signal; and generate an internal synchronization flag in response to determining that the suitable time period exists, wherein in an internal synchronization mode, the gain stage is configured to update a level of the gain in response to the internal synchronization flag, wherein in an external synchronization mode, the gain stage is configured to update the level of the gain in response to receipt of an external synchronization flag received at a synchronization input of the IC.

The IC may further comprise a synchronization select input for receiving a select signal, wherein selection between the internal and external synchronization mode is performed based on the select signal.

The external synchronization flag may be received from a host device.

The synchronization module may be configured to: detect zero-crossing in the monitored input or output signal to determine the suitable time period.

According to another aspect of the disclosure, there is provided an electronic device comprising an IC as described above, or a system as described above, or the gain control circuitry as described above.

The electronic device may comprise a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console a VR or AR device, a mobile telephone, a portable audio player or other portable device, a mixing console, an audio mixing device, a audio recording device, a paging station, an audio input device for use with a computer, a musical instrument, an audio effects processor, an audio surveillance device, a voice capture device, an audio broadcast device, a sound reinforcement device, a wireless electrical musical instrument interface, a wireless microphone, a microphone with digital output, an ultrasound sensing device, an ultrasound recording device, or a sonar device.

Throughout this specification the word "comprise", or variations such as "comprises" or "comprising", will be understood to imply the inclusion of a stated element, integer or step, or group of elements, integers, or steps, but not the exclusion of any other element, integer or step, or group of elements, integers or steps.

BRIEF DESCRIPTION OF DRAWINGS

Embodiments of the present disclosure will now be described by way of non-limiting examples with reference to the drawings, in which.

DESCRIPTION OF EMBODIMENTS

Figure 1:
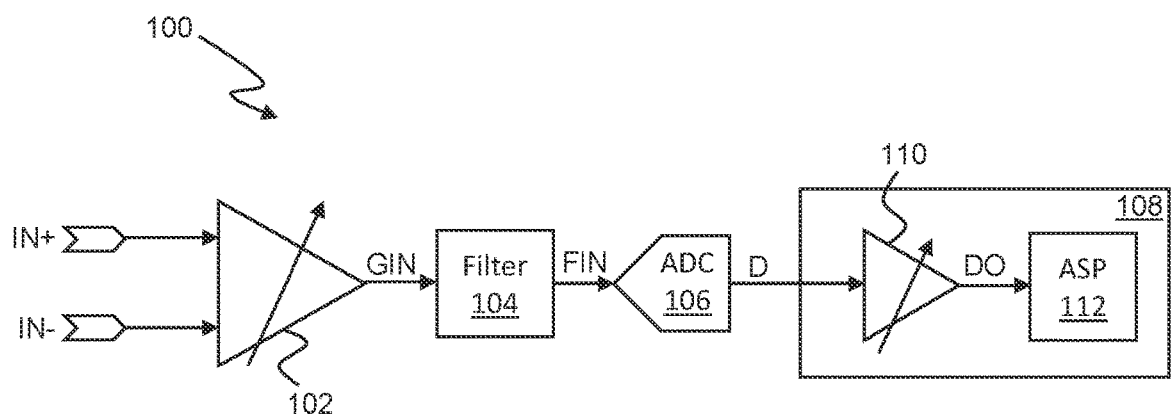
FIG. 1 is a schematic diagram of a prior art signal chain.

FIG. 1 is a schematic diagram of a conventional signal chain 100 for gain control of an analog input signal IN, in this example a differential input signal. The signal chain 100 comprises a low-resolution switched analog gain stage 102, a filter module 104, an analog-to-digital converter (ADC) 106 and an audio processing system 108 comprising a high-resolution digital gain stage 110 and an audio signal processing module 112.

The input signal IN is provided to the analog gain stage 102 which is configured to apply a gain G to the input signal IN. The analog gain stage 102 may comprise a plurality of resistors and a plurality of switches configured to selectively adjust the gain of an amplifier in the signal chain. For example, the plurality of switches may be configured to switch into the signal chain one or more of the plurality of resistors so as to adjust a resistance in the signal chain between an input and an output of the analog gain stage 102. Additionally or alternatively, the plurality of switches may be configured to switch resistors into and out of a feedback loop associated with an amplifier of the gain stage 102, thereby altering the gain of that amplifier. The analog gain stage 102 may thus be configured to adjust a gain applied to the signal chain in steps. Such steps are comparatively larger than any steps in resolution of the digital gain stage 110.

The signal GIN output from the analog gain stage 102 is then provided to the filter module 104 which may comprise one or more analog filters for filtering the input signal IN and output a filtered input signal FIN to the ADC 106. The filter module 104 may be configured to perform one or more additional functions on the signal GIN output from the analog gain stage 102. The filter module 104 may be configured for anti-alias, i.e. to remove signal content higher than the Nyquist frequency (half the sampling frequency). The filter module 104 may also be configured to impedance-match the input signal to an input impedance of the ADC 106 (which is typically very low—hundreds to low thousands of ohms). The ADC 106 then converts the filtered input signal FIN into the digital domain and outputs a digital representation DIN which may be provided to the audio processing system 108 (e.g. a DSP). As noted above, the audio signal processing module 112 comprises a high-resolution digital gain stage configured to implement a higher-resolution (i.e. fine tuning) gain.

In the above implementation, two separate gain stages 102, 110 are implemented.

The analog gain stage 102 is used to provide a wide range of gain adjustment (e.g., between −12 dB and +60 dB of adjustment in steps of 3 dB). The analog gain stage 102 is provided to optimise the dynamic range of the signal path to a level of the input signal IN. The level of the input signal IN may vary over a wide range, depending on the source (e.g., audio source) of the input signal IN. For example, when the signal chain is implemented as part of a mixing console, the input signal IN may be generated by devices having differing maximum signal level. For example, a dynamic microphone may generate a signal having a much lower maximum signal level than, for example, a direct injection audio interface. To minimise noise over the signal chain, as much gain as possible may be applied at the analog gain stage 102. As such, the analog gain stage 102 may be designed so as to provide a large positive range when compared to the digital gain stage 110.

The digital gain stage 110, implemented downstream of the ADC 106, allows a fine-tuning of the gain level (e.g., between −3 dB and +3 dB attenuation in 0.5 dB or 1 dB steps). Adjustment of the gain level may be provided to the user through use of an encoder coupled with a controller (both not shown). The controller may translate the encoder output into gain levels to be applied by each of the analog and digital gain stages 102, 110.

A challenge in systems such as that shown in FIG. 1 is the ability to synchronise updates in the gains applied by the analog and digital gain stages 102, 110. Such systems tend to rely on separate control units to control the timing of gain updates, e.g., through the use of zero-cross-detection algorithms or the like. A challenge is presented in accurately controlling timing between transitions in gain applied by each of the analog and digital gain stages 102, 110. When gain updates across the analog and digital gain stages 102, 110 are misaligned in the signal chain 100, signal transients are introduced which can lead to audible artefacts in the digital audio signal output to the audio signal processing module 112.

Embodiments of the present disclosure aim to address or at least ameliorate one or more of the above issues by providing a converter integrated circuit (IC) having an associated gain control circuit which removes the requirement for a separate timing controller for controlling gain updates. Converter ICs according to embodiments of the present disclosure provide hybrid gain control using a single circuit for controlling gain applied by multiple gain stages in a signal chain.

Figure 2:
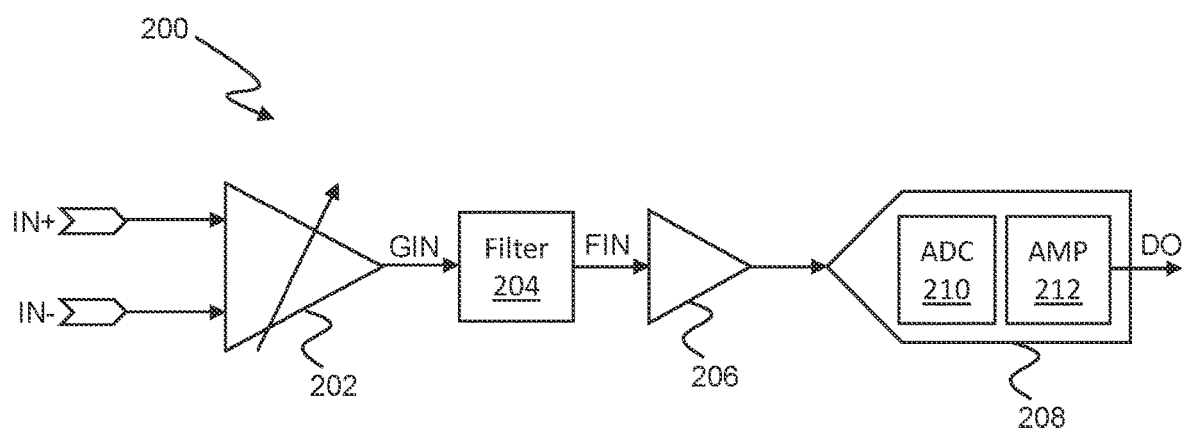
FIG. 2 is a schematic diagram of a signal chain according to embodiments of the present disclosure.

FIG. 2 is a schematic diagram of an example signal chain 200 according to embodiments of the present disclosure. The signal chain 200 comprises an analog gain stage 202, an optional filter module 204, an optional buffer 206 and a combined converter and gain integrated circuit (IC) 208.

An input signal IN, in this non-limiting example a differential input signal, is provided to the analog gain stage 202. The analog gain stage 202 is configured to apply a gain G to the input signal IN. Like the gain stage 102 shown in FIG. 1, the analog gain stage 202 may comprise a plurality of resistors and a plurality of switches configured to selectively adjust the gain of an amplifier in the signal chain. For example, the plurality of switches may be configured to switch into the signal chain one or more of the plurality of resistors so as to adjust a resistance in the signal chain between an input and an output of the analog gain stage 102. Additionally or alternatively, the plurality of switches may be configured to switch resistors into and out of a feedback loop associated with an amplifier of the gain stage 102, thereby altering the gain of that amplifier. The analog gain stage 102 may thus be configured to adjust a gain applied to the signal chain in steps. Such steps are comparatively larger than any steps in resolution of the digital gain stage 110. For example, the analog gain stage 202 may be adjustable in steps of 3 dB and the digital gain stage may be adjustable in steps of 0.5 dB or 1 dB. For example, the analog gain stage 202 may be adjustable between −12 dB and +60 dB in steps of 3 dB and the digital gain stage may be adjustable between −3 dB and +3 dB in steps of 0.5 dB or 1 dB.

The signal GIN output from the analog gain stage 102 is then provided to the filter module 204 which may comprise one or more analog filters for filtering the input signal IN and output a filtered input signal FIN. The filter module 204 may be configured to perform one or more additional functions on the signal GIN output from the analog gain stage 102, similar to the filter module 104.

Optionally, the filtered input signal FIN may be buffered by the buffer 206 (if provided) before being provided to the combined converter and gain IC 208. In some embodiments, the filter module 204 and the buffer 206 may be implemented in a single circuit. For example, the filter module 104 may be implemented as an amplifier stage with one or more capacitors in its feedback network, such capacitors chosen to produce the desired filter characteristics simultaneously with impedance matching.

As will be described in more detail below, the combined converter and gain IC 208 is configured both to convert the received filtered input signal FIN into the digital domain and provide high-resolution gain adjustment of the filtered input signal FIN. The combined converter and gain IC 208 comprises a converter, in this case an ADC 210 (although alternative converters are envisaged), as well as a gain stage 212. The gain stage 212 may be configured to apply a programmable gain to the output of the ADC 210.

The combined converter and gain IC 208 may be configured to synchronise updates of the gain applied by the integrated gain stage 212 with gain updates applied by the analog gain stage 202. Such, synchronisation may include compensation for signal path latency between the analog gain stage 202 and the combined converter and gain IC 208. To aid in synchronisation of gain updates between the analog gain stage 202 and the gain stage 212, the converter and gain IC may comprise control circuitry configured to (digitally) control the analog gain stage 202.

The combined ADC and gain IC 208 may effectively replace the digital gain stage 110 of the audio processing system 108 shown in FIG. 1, thereby simplifying the synchronisation operations to be performed in the signal chain 200.

Various implementations of the above signal chain 200 will now be described with reference to FIGS. 3 to 6. Embodiments described below are described with respect to a two-channel converter. It will, however, be understood that embodiments of the present disclosure are not limited to two channels and may be expanded to any number of channels without departing from the scope of present disclosure. Embodiments described herein also include optional circuitry for internal zero-cross detection and gain ramping which will be described in more detail below.

In the embodiments described herein, whilst various ICs communicate using a serial interface such as the known Serial Peripheral Interface (SPI), it will be appreciated that any conceivable interface may be used for communication. In embodiments in which two or more SPIs are used, such interfaces may be daisy chained, as will be explained in more details below.

Figure 3:
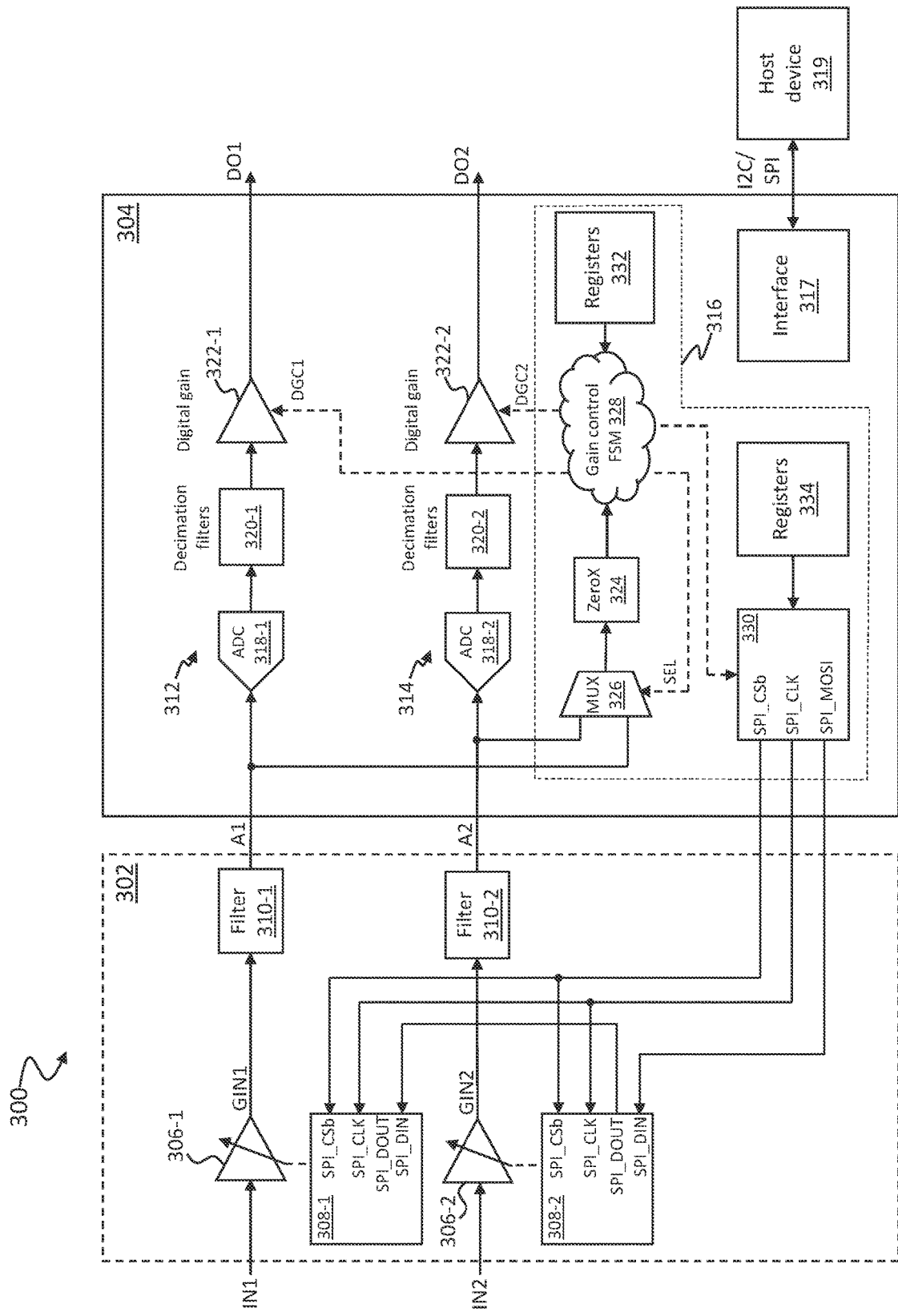
FIG. 3 is a schematic diagram of a gain control system according to embodiments of the present disclosure.

FIG. 3 is a schematic diagram of a two-channel hybrid gain control system 300 according to embodiments of the present disclosure. The control system 300 comprises analog gain circuitry 302 and a converter integrated circuit (IC) 304.

The analog gain circuitry 302 comprises, for a first input channel, a first analog gain stage 306-1, a first gain controller 308-1, and an optional first filter module 310-1. For a second input channel, the analog gain circuitry 302 comprises a second analog gain stage 306-2, a second gain controller 308-2 and an optional second filter module 310-2.

In the first channel, the first gain stage 306-1 is configured to receive a first input signal IN1 and apply a gain in a similar manner to that described above with reference to the analog gain stage 202 of FIG. 2. The gain applied by the first gain stage 306-1 may be controlled by the first gain controller 308-1 as will be described in more detail below.

The first analog input signal GIN1 output from the first gain stage may then be provided to the first filter module 310-1. The first filter module 310-1 may be configured to filter the analog input signal GIN1 and/or drive the input signal A1 in a manner known in the art. The amplified and optionally filtered analog input signal GIN1 is then provided as a first analog signal A1 to the converter IC 304.

In the second channel, the second gain stage 306-2 is configured to receive a second input signal IN2 and apply a gain in a similar manner to that described above with reference to the analog gain stage 202 of FIG. 2. The gain applied by the second gain stage 306-2 may be controlled by the second gain controller 308-1 as will be described in more detail below.

The second analog input signal GIN2 output from the second gain stage 306-2 may then be provided to the second filter module 310-2. The second filter module 310-2 may be configured to filter the analog input signal GIN2 and/or drive the second input signal A2 in a manner known in the art. The amplified and optionally filtered second analog input signal GIN2 is then provided as a second analog signal A2 of the converter IC 304.

It will be appreciated that whilst first and second gain controllers 308-1, 308-2 are shown in FIG. 3, in other embodiments, the first and second gain controllers 308-1, 308-2 may be implemented as a single gain controller. It will also be appreciated that in other embodiments the first and second gain controllers 308-1, 308-2 may be implemented on the converter IC 304. For example, a single gain controller may be provided to control both analog gain of the analog gain circuitry 302 and digital gain in the converter IC 304.

The converter IC 304 comprises a first signal chain 312 for the first channel, a second signal chain 314 for the second channel, and control circuitry 316 for monitoring the first and second signal chains and for controlling digital gain in the first and second signal chains 312, 314, as will be described in more detail below. The converter IC 304 may further comprise interface circuitry 317 for interfacing with a host devices 319 (or more than one host device in some embodiments).

The first signal chain 312 comprises a first ADC 318-1, a first decimator 320-1 and a second digital gain stage 322-1. The first ADC 318-1 is configured to receive and convert the first analog signal A1 from the analog gain circuitry 302 into a first digital signal D1. This first digital signal D1 is decimated by the first decimator 320-1 before being provided to the digital gain stage 322-1. The digital gain stage 322-1 is configured to apply a digital gain based on a digital gain control signal DGC1 received from the control circuitry 316.

The second signal chain 314 comprises a second ADC 318-2, a second decimator 320-2 and a second digital gain stage 322-2. The second ADC 318-2 is configured to receive and convert the second analog signal A2 from the analog gain circuitry 302 into a second digital signal D2. This second digital signal D2 is decimated by the second decimator 320-2 before being provided to the second digital gain stage 322-2. The second digital gain stage 322-2 is configured to apply a digital gain based on a digital gain control signal DGC2 received from the control circuitry 316.

The control circuitry 316 comprises a zero-crossing detector (ZCD) 324, a ZCD multiplexer (MUX) 326, a gain control finite state machine (FSM) 328, and a master analog gain controller 330. The control circuitry 316 may further comprise a first set of registers 332 for the gain control FSM 328 and a second set of register 334 for the master analog gain controller 330. Separate first and second sets of registers 332, 334 may be provided in implementations in which the size of each register 332, 334 is constrained (e.g. due to IC design constraints). In other embodiments, where such constraints do not exist, the first and second sets of registers 332, 334 may be replaced with a single register or set of registers. In such implementations, the single register or set of registers may be large enough to accommodate a single instruction relating both to the digital gain stages 322-1, 322-2 and the analog gain stages 306-1, 306-2.

The ZCD 324 is configured to detect zero crossing of the first and second zero-centred analog signals A1, A2. The ZCD MUX is configured to selectively couple one of the first and second analog signals A1, A2 to the ZCD 324 in response to a MUX select signal SEL received from the gain control FSM 328. The ZCD 324 is configured to output a zero-crossing signal to the gain control FSM 328 which indicates a zero crossing event in the signal received at the ZCD 324 (i.e., the first or second analog signal A1, A2). Whilst in the embodiment shown a single ZCD 324 is provided, in other embodiments a ZCD may be provided for each channel and the output of each ZCD provided to a multiplexer to select between outputs.

As mentioned above, the gain control FSM 328 is configured to output the MUX select signal SEL to the MUX 326 to select between coupling the first analog signal A1 and the second analog signal A2 to the ZCD 324. In addition, the gain control FSM 328 is configured to output the first and second digital gain control signals DGC1, DGC2 to the first and second digital gain stages 322-1, 322-2 and a master analog gain control signal MAGC to the master analog gain controller 330.

The first and second gain control registers 332, 334 are configured to store respective gain parameters for the first and second analog gain stages 306-1, 306-2 and first and second digital gain stages 322-1, 322-2. Such gain parameters may be written into the first and second registers 332, 334 in response to control signals received from the host device 319 via the interface circuitry 317.

During operation, the FSM 328 is configured to monitor a ZCD signal received from the ZCD 324. On detecting of a zero-crossing event, the FSM 328 may output a control signal to the master analog gain controller 330 to update gains of the first and second analog gain stages 306-1, 306-2. The master analog gain controller 330 may, in response, output to the first and second gain controllers 308-1, 308-2 update signals in addition to gain parameters read from the second set of registers 334 by the master analog gain controller 330. In addition, the FSM 328 may update the gain of the digital gain stages 322-1, 322-2 based on gain parameters in the first set of registers 332. The control circuitry 316 is configured to synchronise, in the signal chain, any updates of gain in the analog gain stages 306-1, 306-2 on the one hand and the digital gain stages 322-1, 322-2 on the other.

The master analog gain controller 330 may communicate with the first and second gain controllers 308-1, 308-2 via a serial peripheral interface (SPI). In some embodiments, serial interfaces of the first and second gain controllers 308-1, 308-2 may be daisy chained such that a data line from an SPI of the master analog gain controller 330 passes through the SPI of each of the first and second gain controllers 308-1, 308-2. In such implementations, bits of data may be clocked into the first and second gain controllers 308-1, 308-2 with a common clock signal, the daisy chain forming a shift register. A common select line may be provided to the first and second gain controllers 308-1, 308-2 controlled by the master analog gain controller 330. Assertion or deassertion of the common select line may trigger reading of new gain values provided on the data line and shifted into the first and second gain controllers 308-1, 308-2. As such, by controlling the select line, the master analog gain controller 330 may control the exact time at which gain updates are asserted by each of the first and second gain controllers 308-1, 308-2.

The control circuitry 316 may be configured to account for any latency associated with the signal chain between the analog and digital gain stages 306-1, 306-2, 322-1, 322-2.

As mentioned above, the external analog gain stages 306-1, 306-2 are configurable to apply step changes in gain. Such steps are relatively wide, when compared to the steps provided by the digital gain stages 322-1, 322-2. This allows a host controller in communication with the converter IC 304 (e.g., via interface circuitry 317) to set an arbitrary gain value with the resolution of the internal digital gain stages 322-1, 322-2. The external analog gain stages 306-1, 306-2 may then be switched by the control circuitry 316 to an appropriate gain setting for the required dynamic range whilst the internal digital gain stages 322-1, 322-2 are adapted to set the fine gain.

In some embodiments, a user may set the gain of the first and second channels by rotating an encoder (not shown). In such embodiments, it will therefore be appreciated that gain changes will be sequential. It is desirable to avoid any audible artefacts (e.g., zipper noise, audible gain jumps and the like) whilst smoothly increasing or decreasing gain.

Figure 4:
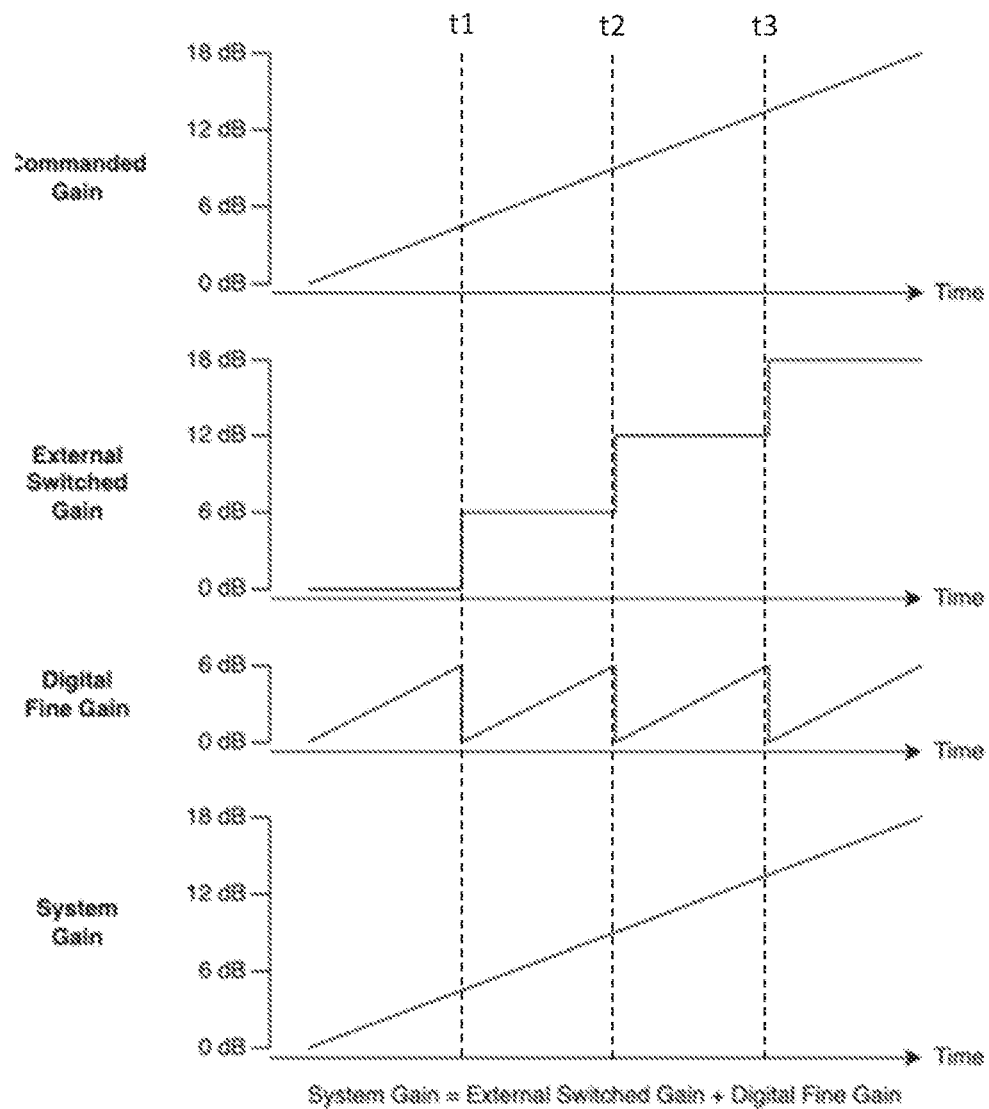
FIG. 4 is a graphical illustration of a gain control regime which may be implemented by the gain control system shown in FIG. 3.

Referring to the first channel of the system 300, FIG. 4 is a graphical illustration of the relative transitions of a commanded gain (e.g., received from the host device 319 via the interface circuitry 317), an external switched gain (i.e., switched gain at the first analog gain stage 306-1), a digital fine gain (i.e., gain applied by first digital gain stage 322-1), and the overall system gain for the first channel. Whilst, in this example, the external switched gain is switched in increments of 6 dB, in other examples the external switched gain may be switched in smaller or larger increments. It can be seen that in order for the system gain to substantially match and to avoid transients in the system gain, transitions of the first analog gain stage 306-1 and the first digital gain stage 322-1 at times t1, t2 and t3 should preferably align. Any misalignment of transitions may lead to discontinuities, artefacts and/or transients in the system gain, and therefore the output signal DO1.

Figure 5:
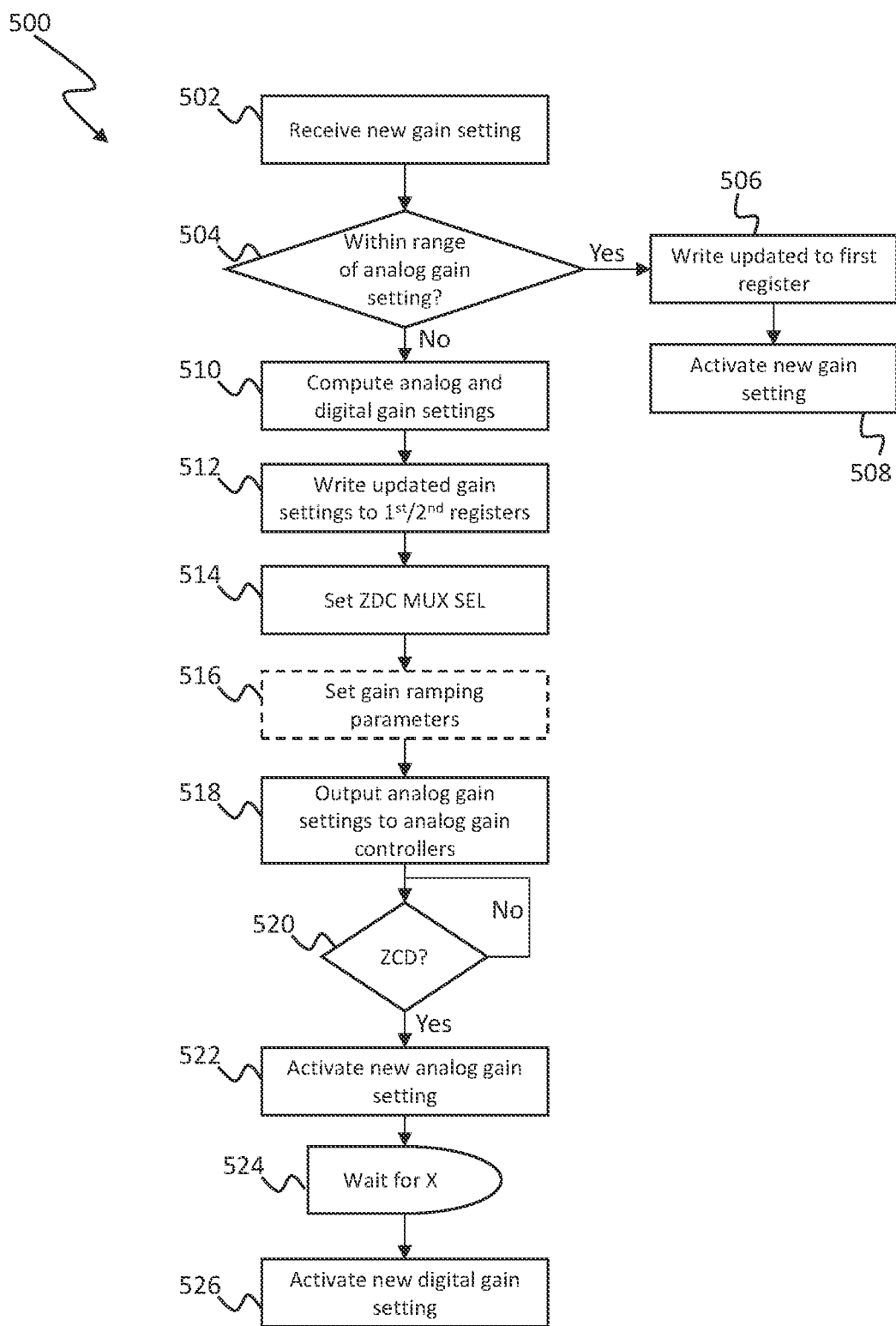
FIG. 5 is a flow chart of a process which may be performed by the gain control system of FIG. 3.

FIG. 5 illustrates an example process 500 implemented by the system 300 of FIG. 3, optionally in coordination with the host device 319 communicating with the system 300. This process 500 for updating gain settings will be described with reference to the first channel in the system 300 shown in FIG. 3. It will, however, be appreciated that it is equally applicable to the second channel.

At step 502, a new gain setting is received, for example via an encoder at the host device 319.

At step 504, it is determined whether the new gain setting is within the dynamic range of the digital gain stage 322-1, given the current setting of the analog gain stage 306-1.

If the new gain setting is within range, then an updated gain value for the first digital gain stage 322-1 is written into the first register at step 506. The control circuitry 316 (or the host device 319) activates the digital gain stage 322-1 gain to be updated and the process 500 is complete.

If on the other hand it is determined that the new gain setting is not within the range for the current gain setting of the analog gain stage 306-1, at step 510, the control circuitry 316 (or the host device 319) computes new gain values for the first analog and digital gain stages 306-1, 322-1.

It will be appreciated that steps 502 to 510 may be implemented at the host device 319, at the IC 304 (e.g., by the control circuitry 316), or a combination of the host device 319 and the IC 304.

At step 512, the control circuitry 316 or the host device 319 via the interface 317 writes or updates the first and second registers 332, 334 with the new gain parameters to be later applied at the first analog and digital gain stages 306-1, 322-1. The registers 332, 334 may include an entire control bit pattern, for example a complete SPI register bit pattern for the first analog gain controller 308-1 connected via the SPI. The format will depend on the register format of the analog gain controller 308-1. Whilst the new analog and digital gain control settings are written to the respective first and second registers 332, 334, neither are activated at this point.

At step 514, the ZCD MUX select signal SEL is sent to the ZCD MUX 326 to couple a respective one of the first and second analog signals A1, A2 to the ZCD 324 (in this case the first analog signal A1).

Optionally, if using gain ramping, a gain step, direction, step size and/or ramp rate may be set at step 516.

At step 518, a gain updated may be triggered, in response to which the analog gain setting may be sent to the first analog gain controller 308-1. For example, the FSM 328 causes the master analog gain controller 330 to write-out the entire bit sequence contained in second registers for the first analog gain controller 308-1. At the end of the bit pattern, a signal SPI_CSb remains (negatively) asserted, ensuring that the gain control module 308-1 does not yet update the gain of the first analog gain stage 306-1.

At step 520, the FSM 328 may monitor for a zero crossing event based on an output from the ZCD 324. Additionally, time-out monitoring may be used. For example, the ZCD may output a time-out signal associated with an extended period of time in which no zero crossing is detected. Such a time-out signal may be used as a trigger for controlling switching in subsequent steps of the process 500.

At step 522, on detection of a zero crossing event in the first input signal A1, the FSM 328 may control the master analog gain controller 330 to de-assert the signal SPI_CSb, thus causing the first analog gain controller 308-1 to switch the first analog gain stage 306-1 to the new analog gain setting.

At step 524, the FSM 328 may wait a predetermined period of time. Such delay may be pre-configured to compensate for filter and/or ADC latency associated with the first signal chain 312.

At Step 526, the FSM 328 then updates the digital gain value of the first digital gain stage 322-1. If a gain step and ramp is used, this step may comprise first performing a gain step according to the configured parameters (discussed above), followed by execution of a gain ramp to the target gain value of the first digital gain stage 322-1.

Figure 6:
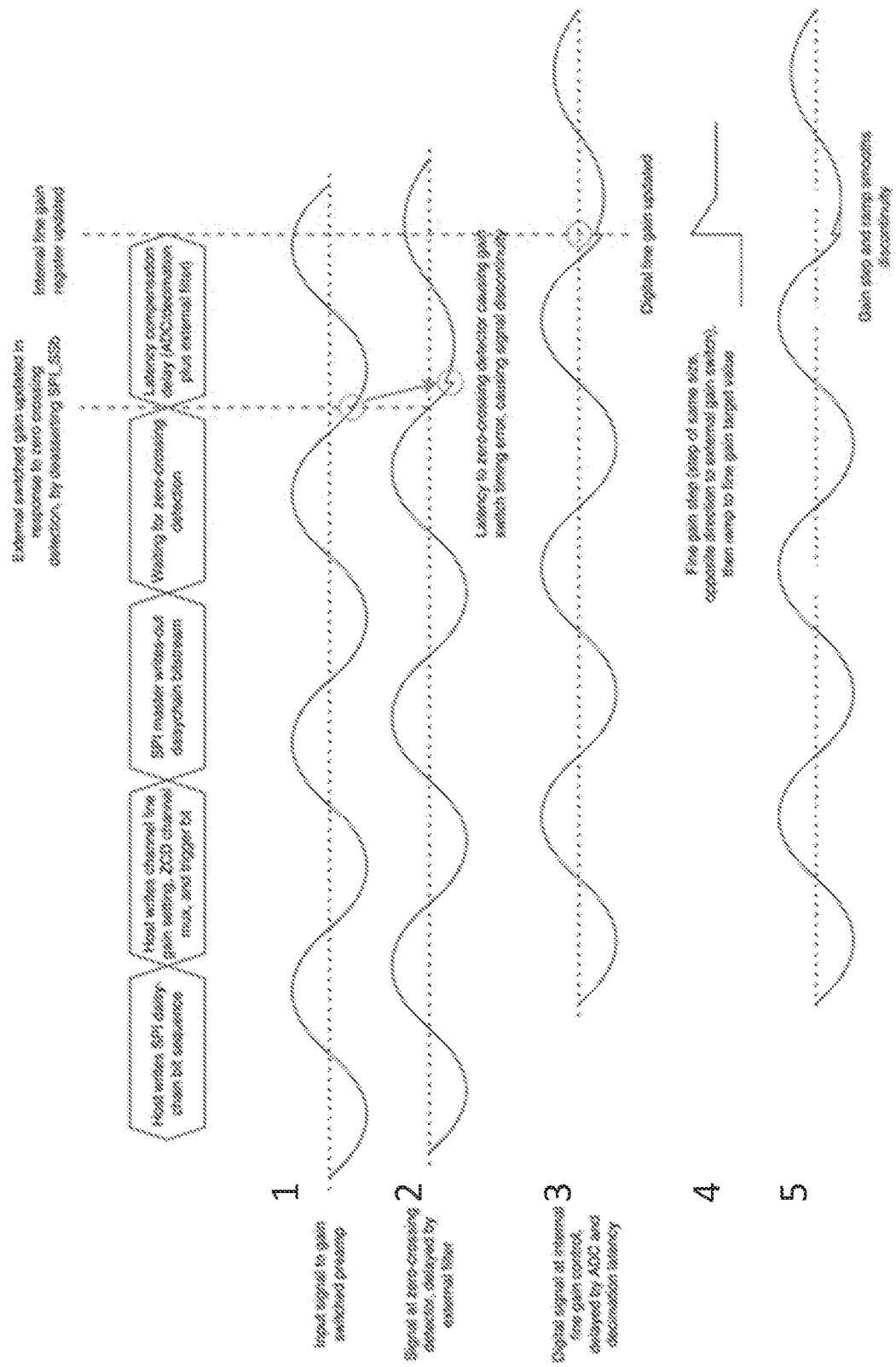
FIG. 6 is a timing diagram for various signals passing through the gain control system shown in FIG. 3.

FIG. 6 is an example timing diagram showing how timing error in switching of the first analog and gain stages 306-1, 322-1 can lead to discontinuities in the converted output signal DO1. The figure shows:

1. An example input signal IN, such as the first input signal IN received at the first analog gain stage 306-1.
2. The same input signal IN as received at the zero-crossing detector ZCD.
3. The digital signal at the input of the first digital gain stage 322-1, delayed by conversion at the first ADC 318-1 and latency associated with the first decimator 320-1.
4. The digital signal at the output of the first digital gain stage 322-1, the discontinuity smoothed due to ramping of the gain change of the first digital gain stage 322-1.

FIG. 6 illustrates how latency compensation delay (i.e., the predetermined delay between activation of the gain change of the first analog gain stage 306-1 and activation of the gain change of the first digital gain stage 322-1) can be tuned to take into account the combination of latency associated with the ADC 318-1 and the decimator 320-1, in addition to the latency associated with the first filter module 310-1 external to the converter IC 304. In doing so, the control circuitry 316 can control the digital gain stage 322-1 gain change to coincide with the signal discontinuity caused by any zero-cross error on the external gain change. In addition if the fine gain change is executed as a step-and-ramp operation or other similar operation, the signal received at the first digital gain stage 322-1 can be compensated to remove any such discontinuity.

If this gain step-and-ramp is implemented such that it can sufficiently compensate for the signal discontinuity, it may turn out that gain changes with no zero-crossing detection are inaudible—in which case, zero-cross detection may not be required.

In some cases, the signal discontinuity may not be perfect, for example due to phase distortion in the signal path (due to the external filter 310-1, the ADC 318-1 and the decimator 320-1). In such cases, it may be that there is still some residual audible signal artefact(s). If gain step-and-ramp is used, the step size, step direction and ramp rate are preferably all configured (e.g., by the host device 319) before a gain update is triggered (e.g., in step 522, in the process 500 of FIG. 5).

Tuning of the latency compensation delay may be programmed by a user (e.g. using a simple timer).

Latency associated with the first ADC 318-1 and the decimator 320-1 is deterministic and may depend on the selected sample rate parameters of the decimator 320-1. As such, data may be provided indicating the latency compensation value to set for different combinations of sample rate and filter type used in the decimator 320-1.

Users may also tune the delay to add any latency associated with the (external) filter module 310-1, in order to assure that the fine gain change (or step-and-ramp) is synchronised with the discontinuity caused by the external analog gain stage.

Figure 7A:
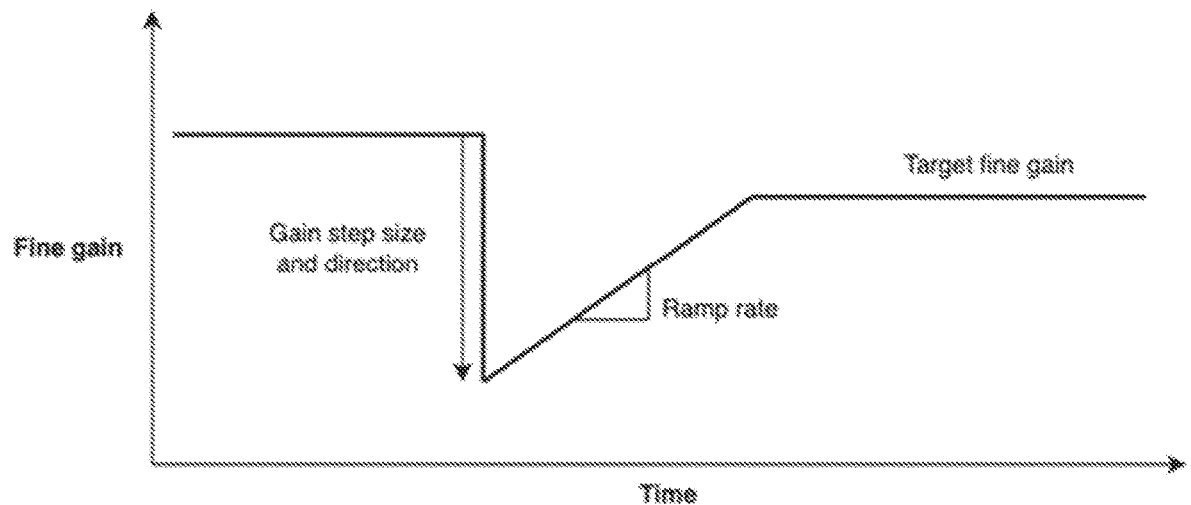
FIG. 7A is a graphical illustration of an example fine-resolution gain control regime.

As illustrated in FIG. 6, the digital gain stage 322-1 may perform a step-and-ramp operation to reach the new commanded value for fine gain. This step-and-ramp operation may have several parameters which can be set by a user, as shown in FIG. 7A. Such parameters may include:

Gain step size—may be set to be the same as the gain steps of the external analog gain stage 306-1.

Gain step direction—may be set by the control circuitry 316 depending on whether the external gain stage 306-1 is increasing or decreasing gain. If the analog gain stage 306-1 increases gain, the gain step may be set to negative; if the analog gain stage 306-1 decreases gain, the gain step is set to positive Ramp rate.

Target fine gain.

As noted above, in the embodiment shown in FIG. 3, first and second sets of registers 332, 334 are provided. In such implementations, the host device 319 coupled via the interface 317 may be configured to update each of the first and second registers 332, 334 to assert a new overall gain value on the system 300. It will be appreciated that the time taken for a gain update to complete may vary, for example by up to 20 ms, partly due to the fact that each gain change is zero-cross aligned. Because of this, there may be instances in which a new gain value is written into the registers 332, 334 by the host midway through a gain update by the gain control FSM 328 and master analog gain controller 330. If such an update occurs, there is a risk of error in the gain applied at the analog gain stages 306-1, 306-2 or the digital gain stages 322-1, 322-2, or both. For example, the gain control FSM 328 may update the digital gain based on the most recent instruction received from the host device 319, whilst the master analog gain controller 330 may control the update of analog gain based on the previous instruction received from the host device 319 (or vice versa).

To avoid error due to register writes that do not synchronise with gain stage updates, various solutions may be implemented. In some embodiments, the host device 319 may be configured to synchronise its writes to the registers 332, 334 with gain updates by the gain control FSM 328 and the first and second gain controllers 308-1, 308-2, so as to avoid misaligned updates. However, such synchronisation can be process intensive on the host device 319. Additionally or alternatively, the host device 319 may not have the necessary functionality to perform such synchronisation.

Accordingly, embodiments of the present disclosure may treat register entries in the first and second sets of registers 332, 334 (including the gain control FSM 328 and the master gain controller 330) atomically, i.e., treated as a single instruction. For example, the gain control FSM 328 may be configured to ensure that entries in the first and second sets of registers 332, 334, pertaining to an overall gain update, are treated as a single unit.

To enable entries in the first and second sets of registers 332, 334 to be treated atomically, the host device 319 may be configured to toggle one or more update flags to indicate that an entry in the first and second sets of registers 332, 334 has been updated. For example, for each channel CH1, CH2, a gain update bit may be toggled (e.g., written high or low) in a register of the first and second sets of registers 332, 334.

The gain control FSM 328 or separate gain update scheduler (not shown) may then successively cycle through register entries in the first and second sets of registers 332, 334, checking the status of the gain update flag for each channel. If the gain update bit is high (or low) for a particular channel, the gain control FSM 328 may then proceed to read the new gain value written into the registers 332, 334, optionally store that value in logic, and subsequently implement the gain update for that channel based on the new gain value. Once the new gain value has been read from the registers 332, 334, the gain control FSM 238 may be configured to clear/reset the update bit so as to indicate that the new gain value has been implemented by the control circuitry 316.

There may be instances in which the host device 319 attempts to write new gain values to the registers 332, 334 at the same time as the gain control FSM 328 (or gain update scheduler) reads the update bit for a particular channel. To avoid simultaneous reading and writing of the same set of first and second registers 332, 334, the gain control FSM 328 may stall during periods in which the host device 319 is writing to registers which the gain control FSM 328 is about to check. The control circuitry 316 may determine a write status of the host device 319 by monitoring one or more signals at the interface 317.

By treating the first and second registers 332, 334 atomically, the host device 319 may have the freedom to update gain values in the registers 332, 334 asynchronously without risk of introducing error due to asynchronous reads of the registers 332, 334 by the master analog gain controller 330 on the one hand and the gain control FSM 328 on the other hand. Implementation of this process will be described in more detail below.

Whilst in the embodiment shown in FIG. 3, zero-cross detection is implemented on the converter IC 304, in other embodiments zero-cross detection may be implemented externally to the converter IC 304. For example, instead of providing the ZCD 324, one or more separate zero-cross detectors may be provided external to the converter IC 304. In which case, the converter IC 304 may comprise one or more inputs to receive one or more control signals from the one or more separate zero-cross detectors.

It will be appreciated that in practice, some off-the-shelf gain switched devices incorporate zero-cross detection. Such zero-cross detection may be used internally to time the gain switch itself. Such implementations may reduce or ameliorate latency error associated with zero-cross detection (described above). Some such devices, for example the THAT5173 digitally programmable gain controller IC provided by THAT corporation, include a zero-cross detection output, which signals the timing to the gain switch. Embodiments of the present disclosure may utilise such devices for the timing of digital gain switching within converter ICs such as those described herein.

In some embodiments, multiple zero-cross detection signals received from the one or more separate zero-cross detectors may be provided to the converter IC 304 via a single pin.

Figure 7B:
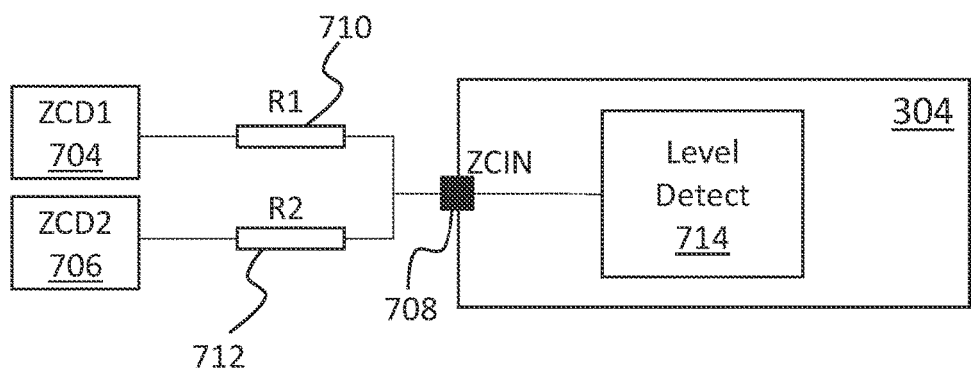
FIG. 7B is a schematic diagram of level detection circuitry for processing zero-cross detection signals.

FIG. 7B illustrates an example interface 702 between first and second external zero-cross detectors 704, 706 and the converter IC 304. The first zero-cross detector 704 is coupled to a zero-cross input node 708 via a first resistor 710 having a first resistance R1. The second zero-cross detector 706 is coupled to the zero-cross input node 708 via a second resistor 712 having a second resistance R2. The converter IC 304 comprises a level detect circuit 714 coupled to the zero-cross input node 708 and configured to determine which of the first and second zero-cross detectors 704, 706 has toggled.

The first and second resistances R1, R2 are chosen to be different. For example, if the first and second resistances R1, R2 are chosen such that R2=2R1, then a proportional division of the logic high level is seen on the zero-cross input node 708 when either of the zero-cross detectors 704, 706 outputs a logic high.

Figure 7C:
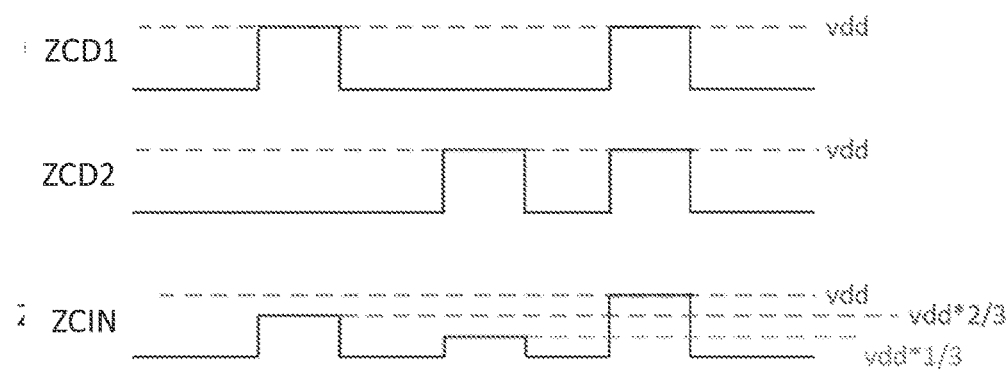
FIG. 7C is a timing diagram for the level detection circuitry shown in FIG. 7B.

FIG. 7C graphically illustrates this regime. When the first zero-cross detector 704 outputs logic high, the ZC input node 708 is toggled to a first voltage ⅔*VDD, where VDD is a supply voltage of the system 300. When the second zero-cross detector 706 outputs logic high, the ZC input node 708 is toggled to a second voltage ½*VDD. When both of the first and second zero-cross detectors 704, 706 are toggled high, the ZC input node is pulled to VDD.

The above regime can be scaled to connect more than two zero-cross detectors to the sample pin. This may be achieved by increasing the complexity of the resistor network coupled between the zero-cross detectors and the ZC input node and by increasing the complexity of the level detect circuit.

For example, certain zero-cross detectors, such as those incorporated into the THAT5173 digitally programmable gain controller IC, may be configured to send a zero-cross or not zero-cross signal. In such an example, it may be sufficient to only distinguish between all inputs provided to the ZC input node 708 being at ground, or all apart from one of the inputs provided to the ZC input node 708 being at ground.

Figure 7D:
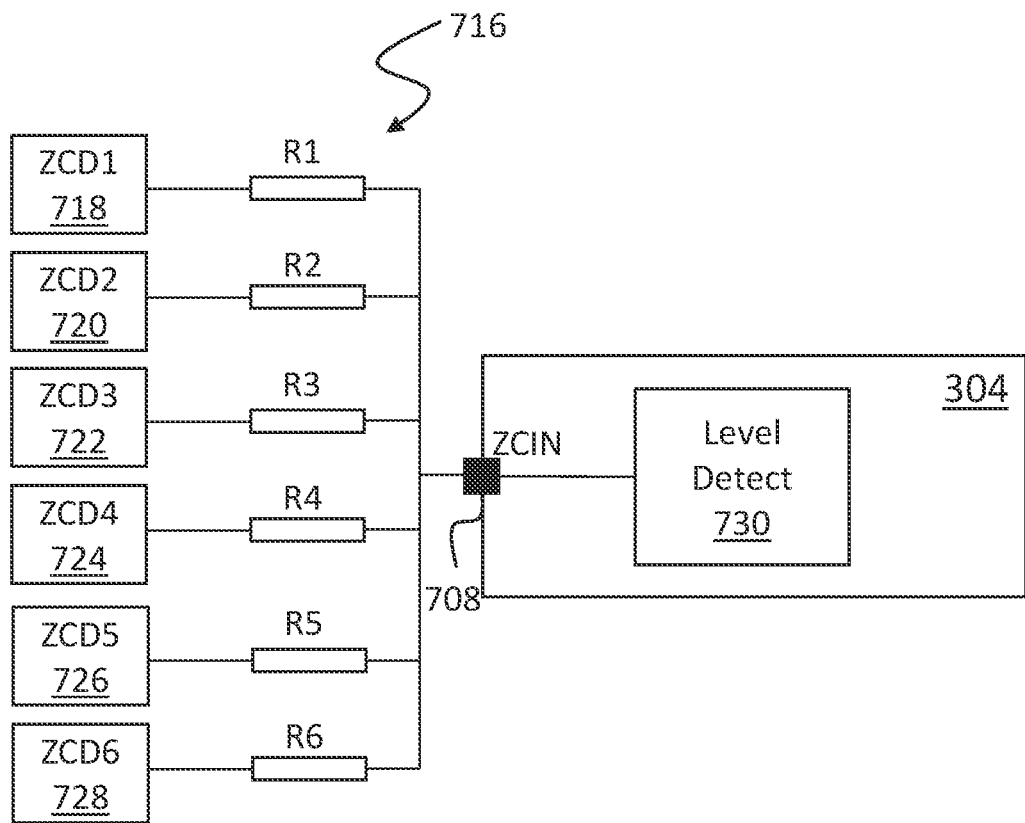
FIG. 7D is a schematic diagram of level detection circuitry for processing zero-cross detection signals.

FIG. 7D shows an example interface 716 which is a variation of the interface 702 shown in FIG. 7B for coupling six zero-cross detectors (ZCDs) 718, 720, 722, 724, 726, 728 to the ZC input node 708. Each of the ZCDs 718:728 are coupled to the ZC input node 708 via a respective resistor R1, R2, R3, R3, R5, R6. A level detect circuit 730 is provided in the converter IC 304, the level detect circuit 730 configured to detect a voltage level at the ZC input node 708.

Figure 7E:
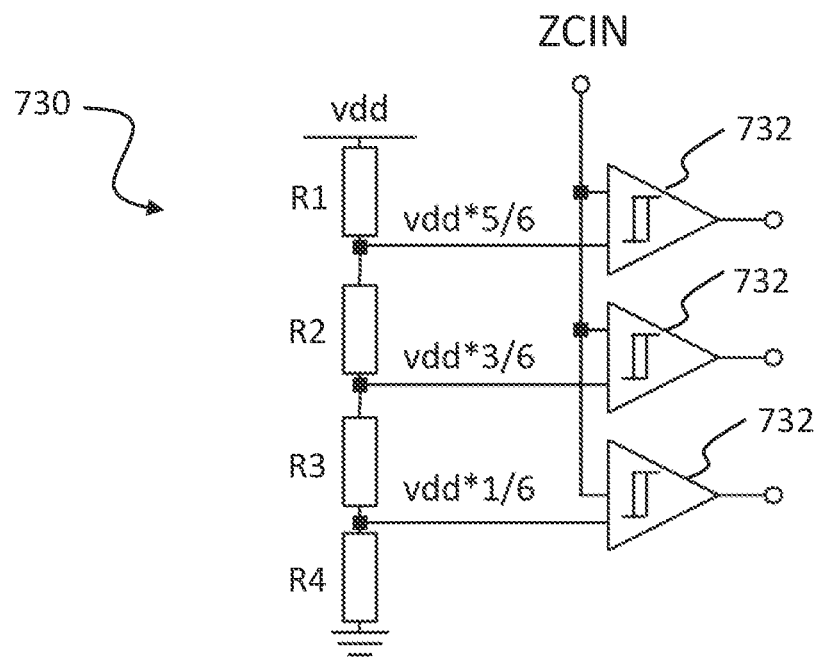
FIG. 7E is a schematic diagram of a flash analog-to-digital converter (ADC)

In some embodiments, it may be a requirement to determine which of the ZCDs 718:724 has triggered the ZC input node 708. FIG. 7E shows an example implementation of the level detect circuit 730 as a flash converter. The circuit 730 comprises a resistor string comprising a plurality of resistors R7, R8, R9, R10 coupled together in series between a supply voltage VDD and ground GND. The circuit 730 further comprises a plurality of comparators 732, 733, 734. A first input of each of the comparators 732, 733, 734 is coupled to the ZC input node 708. A second input of each of the comparators 732, 733, 734 is coupled to respective nodes of the resistor string, one second input coupled to a respective node between each of the resistors R7, R8. R9, R10. By carefully selecting the value of the resistors R1:R6, different combinations of logic high and low output from the ZCDs 718:728 will lead to a unique combination of voltages that can be detected using the flash converter comprised in the level detection circuit 730. It will be appreciated that other conceivable conversion techniques are known in the art.

Figure 8:
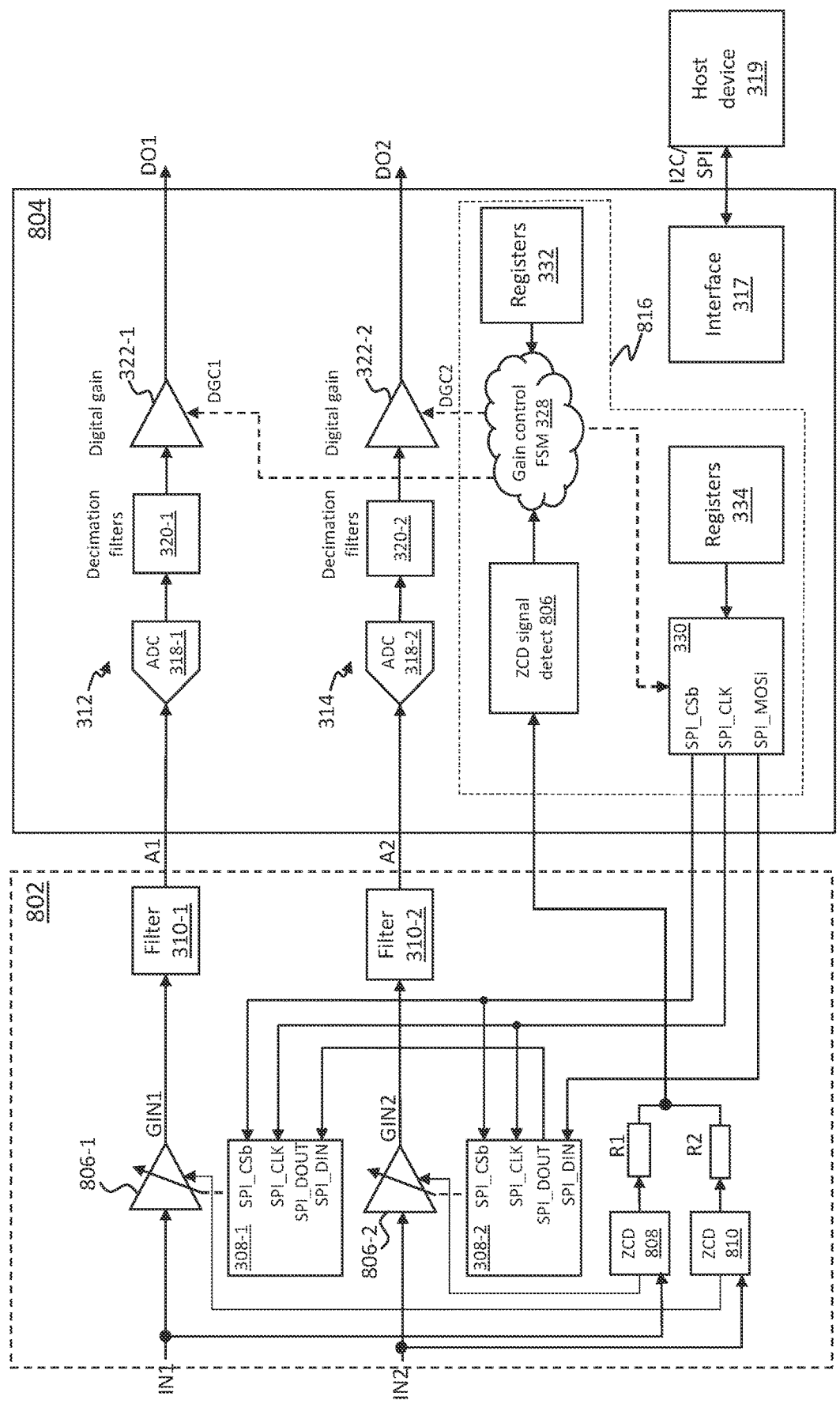
FIG. 8 is a schematic diagram of a gain control regime which may be implemented by the gain control system.

FIG. 8 is a schematic diagram of an example two-channel hybrid gain control system 800 according to embodiments of the present disclosure. The control system 800 is a variation of the system 300 shown in FIG. 3, like parts having been given like numbering. Like the control system 300 of FIG. 3, the control system 800 comprises analog gain circuitry 802 and a converter IC 804.

The converter IC 804 differs from the converter IC 304 of the control system 300 in that the MUX 326 and ZCD 324 are replaced with a ZCD signal detector 806.

The analog gain circuitry 802 differs from the analog gain circuitry 302 of FIG. 3 by the provision of first and second analog gain stages 806-1, 806-2 in place of gain stages 306-1, 306-2 and further with the addition of respective first and second ZCDs 808, 810 configured to detect respective zero-crossing events in respect first and second input signals IN1, IN2 provided to the first and second analog gain stages 806-1, 806-2. Outputs of the first and second ZCDs 808,810 are coupled via respective first and second resistors R1, R2 to a ZCD output node Z1 which is coupled to an input of the ZCD signal detector 806 of the converter IC 804. An output of the ZCD signal detector 806 is provided to the FSM 328.

The first and second gain stages 806-1, 806-2 are further configured to change gain state on detection of zero-crossing in the input signals IN1, IN2 by the ZCDs 808, 810.

Figure 9:
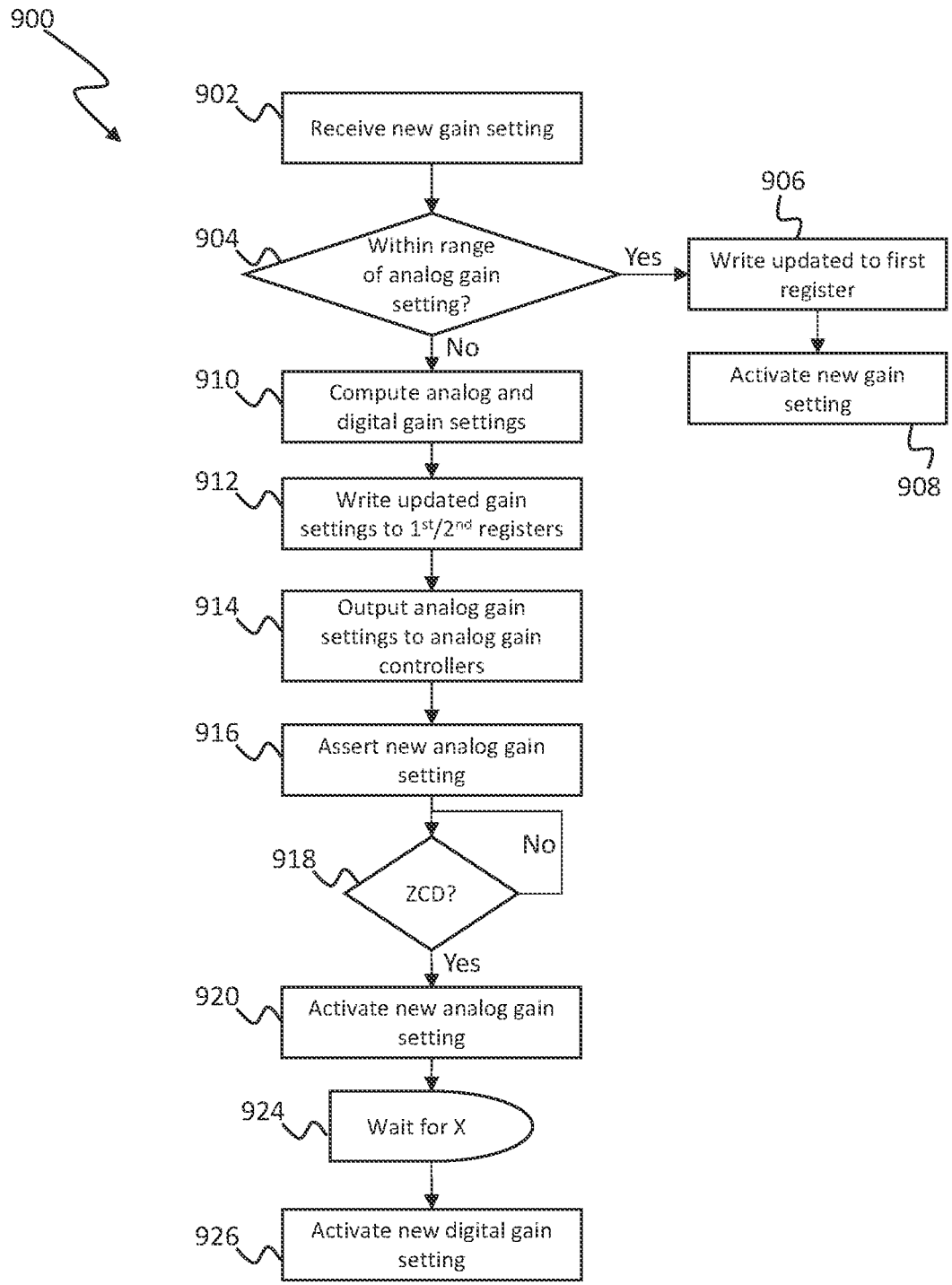
FIG. 9 is a flow chart of a process which may be performed by the gain control system of FIG. 8.

FIG. 9 illustrates an example process 900 implemented by the system 300 of FIG. 3. This process 500 for updating gain settings will be described with reference to the first channel in the system 300 shown in FIG. 3. It will, however, be appreciated that it is equally applicable to the second channel.

At step 902, a new gain setting is received, for example via an encoder in a host device 319.

At step 904, it is determined whether the new gain setting is within dynamic range for the current setting of the analog gain stage 306-1. |

If the new gain setting is within range, then an updated gain value for the first digital gain stage 322-1 is written into the first register at step 906. The control circuitry 316 activates the digital gain stage 322-1 gain to be updated and the process 900 is complete.

If on the other hand it is determined that the new gain setting is not within the range for the current gain setting of the analog gain stage 806-1, at step 910, the control circuitry 816 (or the host device 319) computes new gain values for the first analog and digital gain stages 306-1, 322-1.

At step 912, the control circuitry 816 or host (not shown) writes or updates the first and second registers 332, 334 with the new gain parameters to be later applied at the first analog and digital gain stages 806-1, 322-1. The registers 332, 334 may include an entire control bit pattern, for example a complete SPI register bit pattern for the first analog gain controller 308-1 connected via the SPI. The format will depend on the register format of the analog gain controller 308-1. Whilst the new analog and digital gain control settings are written to the respective first and second registers 332, 334, neither are activated at this point.

At step 914, a gain updated may be triggered, in response to which the analog gain setting may be sent to the first analog gain controller 308-1. For example, the FSM 328 causes the master analog gain controller 330 to write-out the entire bit sequence contained in second registers for the first gain controller 308-1. At the end of the bit pattern, at step 916, a signal SPI_CSb is positively asserted, thereby immediately activating the new analog gain settings at the first analog gain stage 806-1.

In response to receiving a command to change gain, at step 918, the first gain stage 806-1 waits for a zero-crossing event detected by the first ZCD 808.

Upon detection of a zero-crossing, the ZCD 808 outputs a signal to the first gain stage 806-1 and the ZCD signal detector 806. In response, at step 920, the gain of the first gain stage 806-1 changes and the FSM 328 receives an indication of zero-crossing in the input signal IN1 from the ZCD signal detector 806.

At step 924, the FSM 328 may wait a predetermined period of time. Such delay may be pre-configured to compensate for filter and/or ADC latency associated with the first signal chain 312.

At Step 926, after the predetermined time delay, the FSM 328 then updates the digital gain value of the first digital gain stage 322-1. If a gain step and ramp is used, this step may comprise first performing a gain step according to the configured parameters (discussed above), followed by execution of a gain ramp to the target gain value of the first digital gain stage 322-1.

With negligible zero-crossing error, there is unlikely to be a signal discontinuity, so the step-and-ramp feature described above may be less useful. The external gain step and fine gain adjustment should be substantially coincident with respect to the signal, on a zero-crossing.

In various signal chain systems, such as those described above, transients in output signals caused by switching and events related to switching can result in audible artefacts in such output signals. Such transients may be caused by one or more of charge injection, misalignment between internal and external gain switching, and/or group delay associated with filter variations.

Embodiments of the present disclosure aim to address or at least ameliorate one or more of the above issues. Specifically, embodiments of the present disclosure may ameliorate or prevent the occurrence of such artefacts in an output signal by configuring a converter IC to mask the transient in the input signal with a masking signal.

Figure 10:
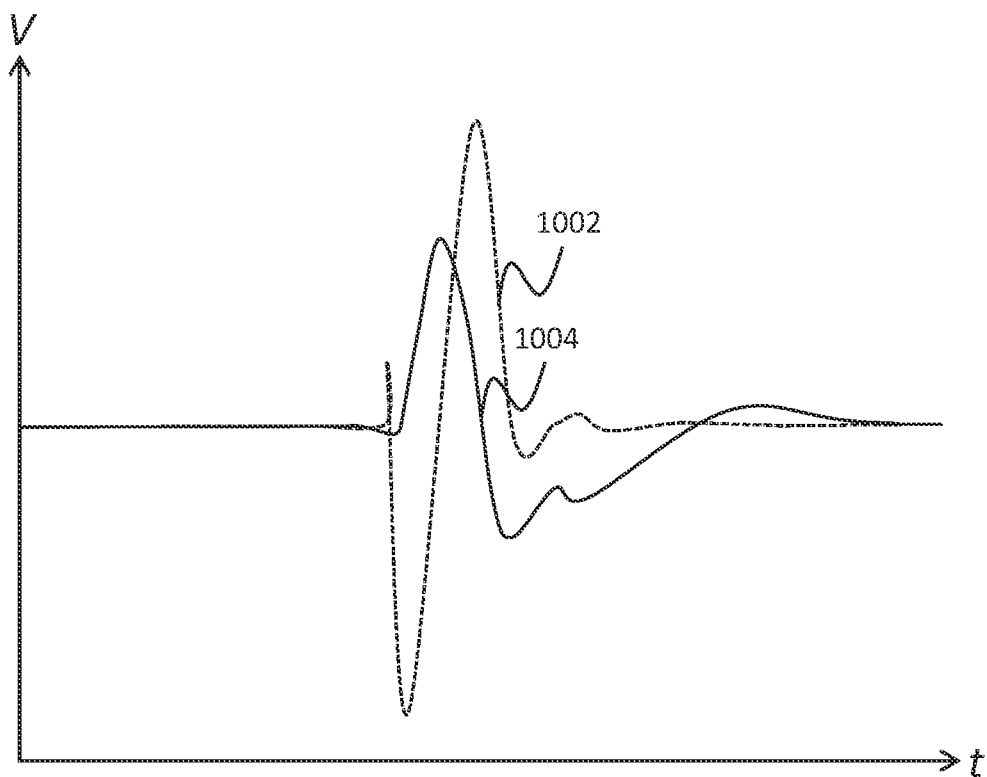
FIG. 10 is a graphical illustration of a transient signal.

FIG. 10 graphically illustrates an example transient in a signal provided to the input of an analog-to-digital converter (ADC). This example transient is typical of a transient caused by switching operation of an analog multiplexer. Two waveforms 1002, 1004 are shown. The first waveform 1002 is the initial transient incident at the ADC. The second waveform 1004 is shown after some analog processing. Each division in the graphical illustration represents 5 microseconds. It can be seen that these transients are short relative to a typical audio sample rate (e.g., 48 kHz—equivalent sample period of around 20.8 microseconds). As such, following decimation, a transient such as that shown tends to approximate the impulse response of the ADC and its decimation filters. Such transients also tend to have approximately consistent amplitude.

Figure 11:
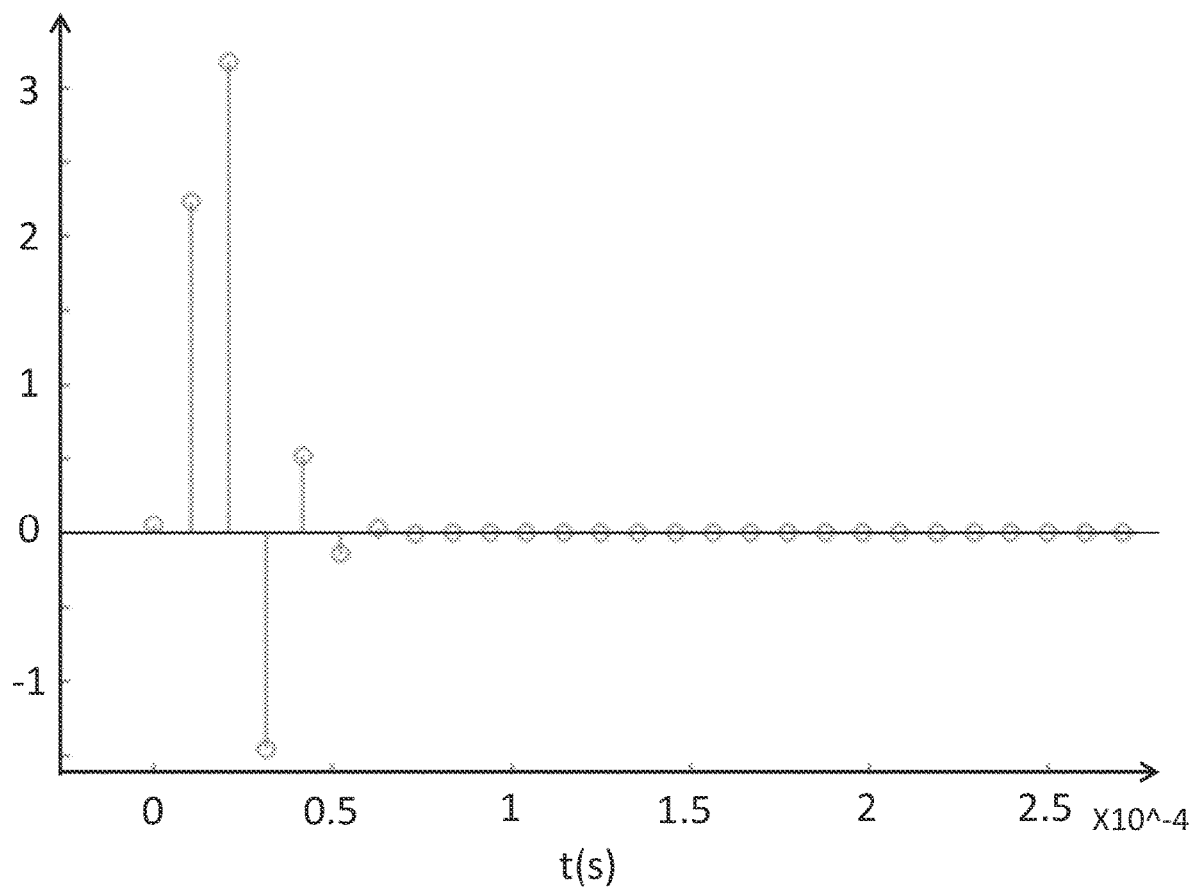
FIG. 11 is a graphical illustration of an example digital representation of the transient signal shown in FIG. 10.

FIG. 11 is a graphical illustration of an example converted and decimated digital representation of the transient shown in FIG. 10. It can be seen that the peak amplitude of the transient is small relative to full scale at about $3\times10^{-3}$, or about −50 dBFS. It can also be seen that only the first few sample of the post-decimation transient are of significant amplitude, and therefore audible.

Figure 12:
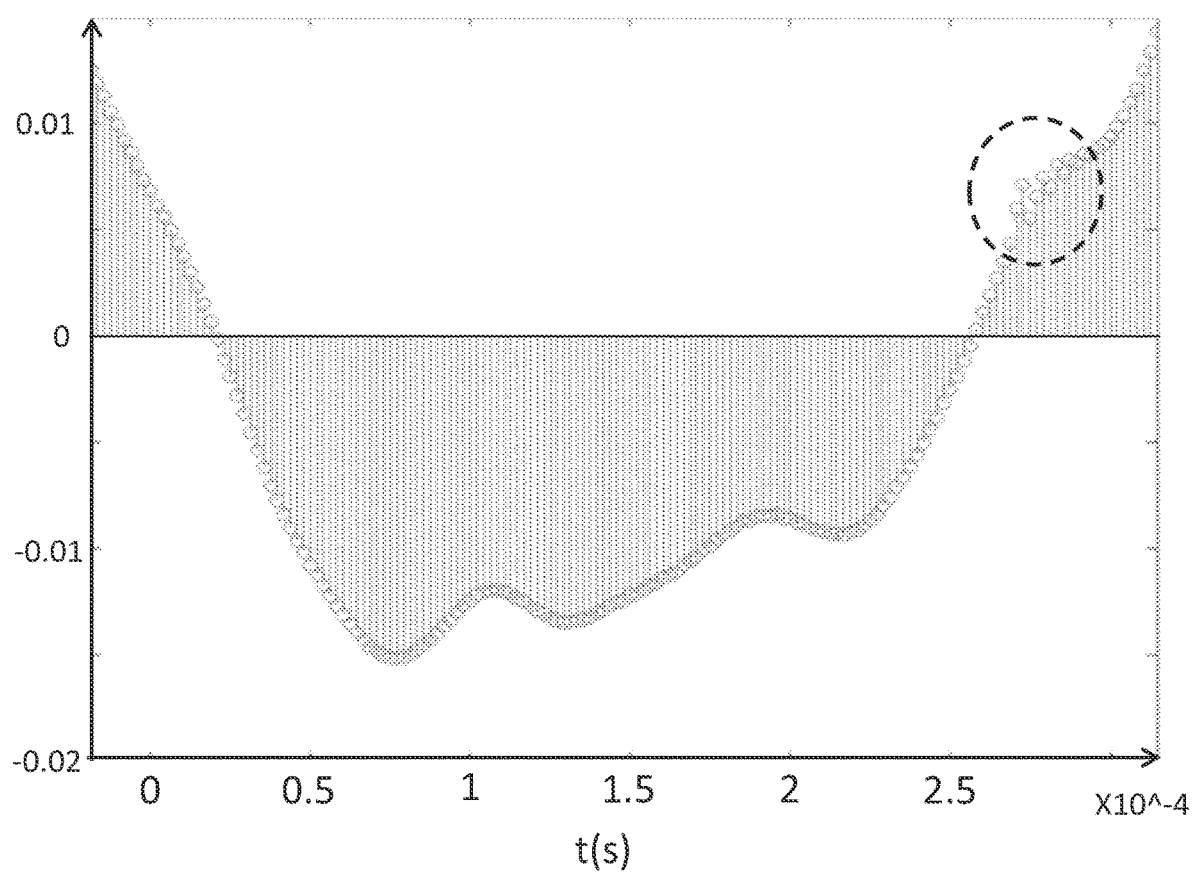
FIG. 12 is a graphical illustration of a digital signal comprising a transient.

FIG. 12 is a graphical illustration of a further example converted and decimated digital signal, converted by an ADC, such as those described above. The transient error in the signal is circled.

Figure 13:
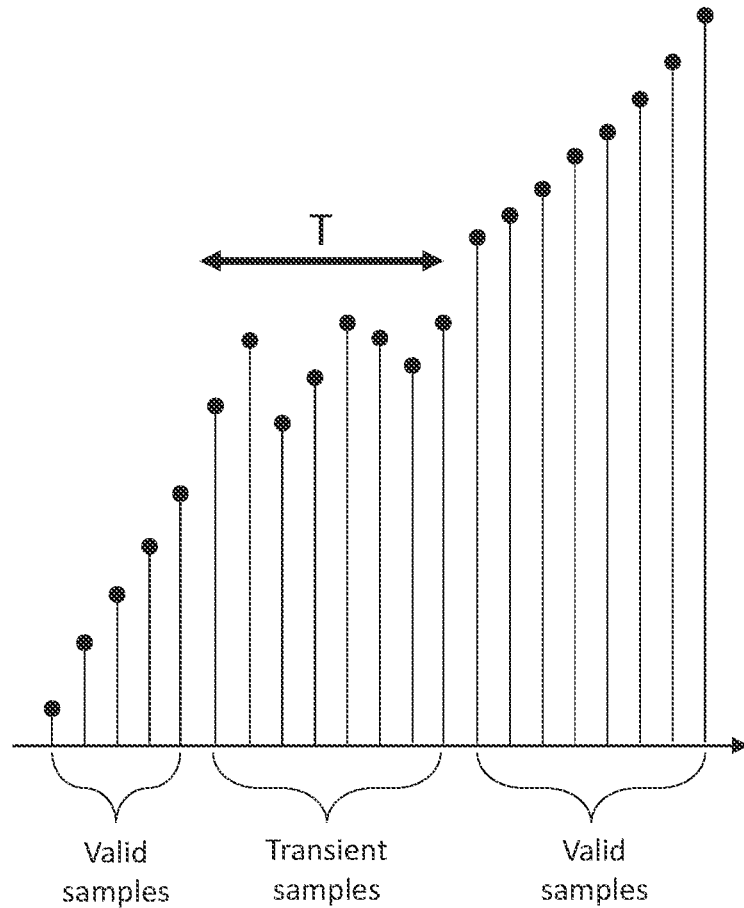
FIG. 13 is a graphical illustration of a digital signal comprising a transient.

FIG. 13 is a close up graphical illustration of the circled area of FIG. 12. It can be seen that valid unaffected samples (herein referred to as valid preceding samples) are followed by eight affected samples (herein referred to as transient samples or masked samples), which themselves are followed by eight unaffected samples (herein referred to as valid following samples).

Embodiments of the present disclosure aim to mask or replace components of a received signal which are affected by a transient. Such masking or replacement is conducted in such a manner that the modified signal is improved when compared to an unmodified signal. Such improvement may cause the modified signal to be perceived by a human ear to be closer to the signal prior to addition of the transient, when compared to the unmodified signal. A further aim is that such improvements lead to a perception of little or no distortion when listened to by a human ear. Several novel techniques are described herein with varying performance vs cost trade-offs.

FIGS. 14 to 17 graphically illustrate several masking techniques.

Figure 14:
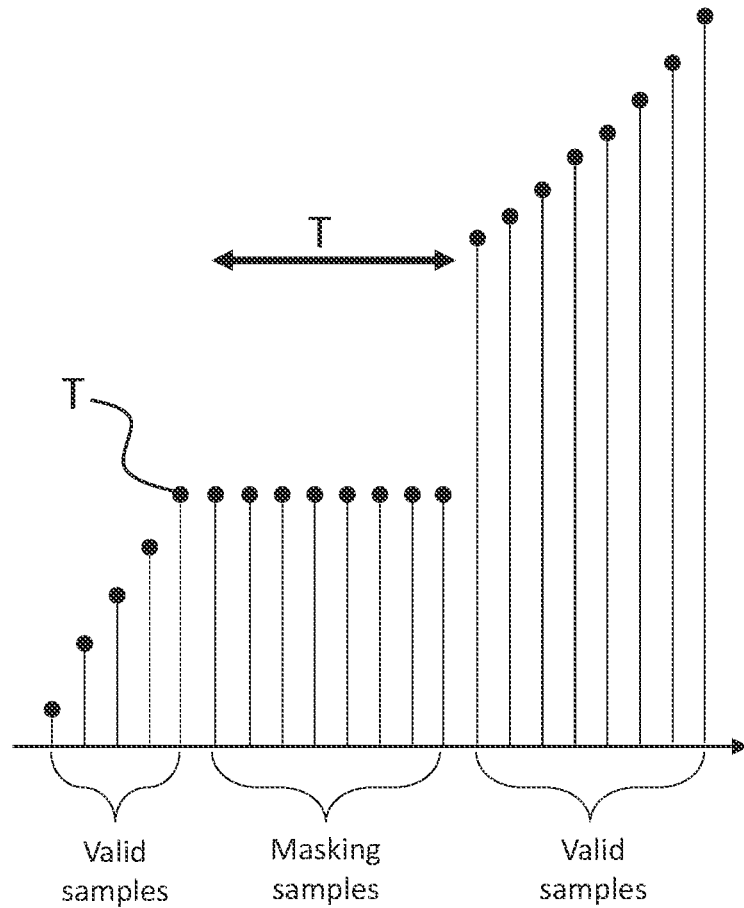
FIGS. 14 to 18 is a graphical illustration of an example masked digital signal, the transient in the signal having been masked by a masking signal.

In a first example technique, as shown in FIG. 14, each transient sample of the converted signal is replaced by masking sample having an amplitude which is substantially equal to a previous valid sample. In FIG. 14, the amplitude of the last preceding valid sample is used as the amplitude for each of the masking samples (i.e. the following eight samples). It will be appreciated that embodiments of the present disclosure are not limited to use of the last preceding valid sample. Additionally, in other embodiments, the amplitude of the masking samples may not be set to be exactly the amplitude of a preceding valid sample. For example, the amplitude of the masking sample may be set to be equal to an amplitude of a following valid sample (i.e. a sample immediately following the last transient sample—e.g., the first valid following sample).

It has been found that, for optimal performance of this "sample hold" technique, it may preferable only to mask some of the transient samples. Specifically, it may be preferably to mask only transient samples of large amplitude. For example, transient samples below a certain threshold amplitude will be inaudible and so masking of such transient samples may not provide a perceived benefit to the human ear. Additionally, the longer the input signal is held at a single amplitude (for example due to extended sample hold masking as described above), the more audible any artefact associated with such a hold will be to the human ear. This is clearly illustrated in FIG. 13 which shows a large jump in amplitude between the final masking sample and the first valid sample following the masking samples, such a jump leading to a potentially audible artefact.

At a conventional bit rate of 48 kHz, with a low-latency design of decimation filter, it has been found that an optimal hold time (i.e. masking period) is five samples. In this example, low-latency may be considered to be under ten samples. This hold time allows for hiding of the strongest components of a typical transient whilst at the sample time minimizing any audible artefact associated with the hold itself. It will be appreciated that the duration of the optimal hold time may be dependent on decimation filter characteristics since transients associated with the gain switching described above tend to approximate the impulse response of the decimation filter (due to their relatively short duration compared to sample rate). In some embodiments, the duration of the hold may be dependent on signal level. For example, for signal levels over a predetermined threshold, the hold time may be reduced, to say 2 or 3 samples.

It will be appreciated that in some input signal conditions, implementation of sample hold masking may lead to undesirable artefacts, for example by causing a more audible signal error than the transient itself. Accordingly, it may be preferable to apply this technique is performed only under certain conditions. The audibility of the signal error is proportional to the product of the sample hold duration and the rate of change of the signal. The higher the rate of change of the signal, the more audible the signal error associated with the sample hold. As such, in some embodiments, the rate of change of the signal may be monitored and the sample hold performed when the rate of change is below a threshold rate.

As mentioned above, the higher the input signal level the more audible sample hold masking becomes (since the absolute error resulting from the hold is proportional to the signal level). In addition to this, the effect of temporal and spectral masking is stronger for louder sounds. As regards the transient itself, the higher the input signal level, the less audible the discontinuity due to the transient (in many cases inaudible). This is because the transient amplitude tends to be small compared to the maximum (full scale) signal amplitude. As such, the relative error caused by the transient is smaller. Additionally, unlike amplitude error caused by sample hold masking that is closely related to the amplitude of the signal itself, the amplitude of the error caused by the transient is constant, such that a ratio of transient error amplitude to sample hold masking error amplitude reduces as signal amplitude increases. In view of the above, sample hold masking may be performed only if the signal level is below a predetermined threshold.

For embodiments described herein, signal level may be defined as an approximation of perceived signal level. There are several ways of approximating perceived signal level. For example, perceived signal level may be approximated as a root mean square (RMS) signal level over a certain time period (time constant). For example, the time constant may be approximately equal to the tonal resolution of human hearing. For example, the time constant may be set to approximate the period of the lowest audible frequency component in a signal. In some embodiments, the RMS time constant may be set to around 50 ms (i.e., $1/20$ Hz), i.e. an approximate lower frequency limit of human hearing.

It will be appreciated that a calculation of true RMS of a signal over a certain time period can be computationally intensive. As such, an optimised RMS calculation technique may be implemented to reduce processor burden. For example, in place of calculating RMS, a moving average of the signal magnitude (e.g., average of the signal absolute value) may be calculated. Whilst the value of approximated perceived signal level may be slightly different to true RMS, the approximation is sufficiently close for applications described herein. Using the average signal magnitude obviates the need to perform squaring and square rooting functions in hardware (or software).

In a further optimisation, an exponential moving average magnitude algorithm may be implemented. Such an implementation may save significant memory usage and processing power. In some embodiments, an exponential moving average signal threshold for triggering masking using the above sample hold technique may be in the region of −45 dB.

As noted previously, the above-described sample hold technique can lead to signal error and discontinuities which may be audible. To address such problems, the above sample hold technique may be adapted to apply a ramp at the beginning (i.e., ramp in) and/or the end (i.e., ramp out) of the masking signal. In doing so, the transition in the output signal between the preceding valid sample and the masking signal may be smoothed. Additionally the transition in the output signal between the masking signal and the following valid samples may also be smoothed. These smoothed transitions at the start of and after the masking may reduce the audibility of the masking.

Figure 15:
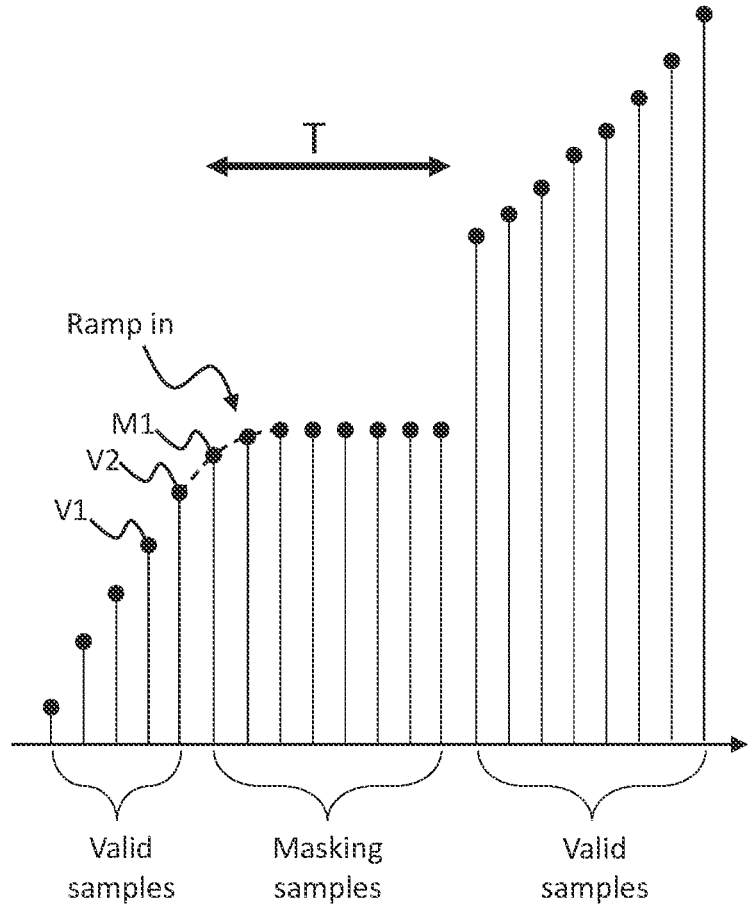

FIG. 15 is a graphical illustration of a smoothed sample hold masking signal which implements ramp in, that is smoothing the transition between a preceding valid sample and a sample amplitude hold (i.e. at a fixed amplitude). As shown in FIG. 15, the ramp in is preferably non-linear as opposed to linear. Such a nonlinear ramp may tend over time towards a hold amplitude, which results in a smoother signal when compared to a masking signal which holds at a fixed amplitude from the first masking sample of the masking signal.

Various techniques exists to achieve the smooth ramp in shown in FIG. 15. In some embodiments, a delta between two preceding valid samples before the masking sample is calculated. The amplitude of the first masking sample may be set to be equal to the sum of the last of the two preceding valid samples and the delta. For example, with reference to FIG. 15, the amplitude AMN of the nth masking sample MN may be defined by the following equation:

$$A_{MN} = A_{V2} + (A_{V2} - A_{V1}) * k_{MN}$$

Where $k_{MN}$ is scaling factor which successively reduces for each masking sample after k until the end of the hold duration. In doing so, the change in masking signal amplitude from one masking sample to the next decreases over the duration of the hold. In one example, $k_{M1}=1$ and $k_{M2}=0.8$, $k_{M3}=0.6$ and so on.

The rate of change of the scaling factor may be configurable. For example, rate of change of the scaling factor $k_{MN}$ may increase as the duration of the masking signal decreases. Likewise, the rate of change of the scaling factor $k_{MN}$ may decrease as the duration of the masking signal increases.

Figure 16:
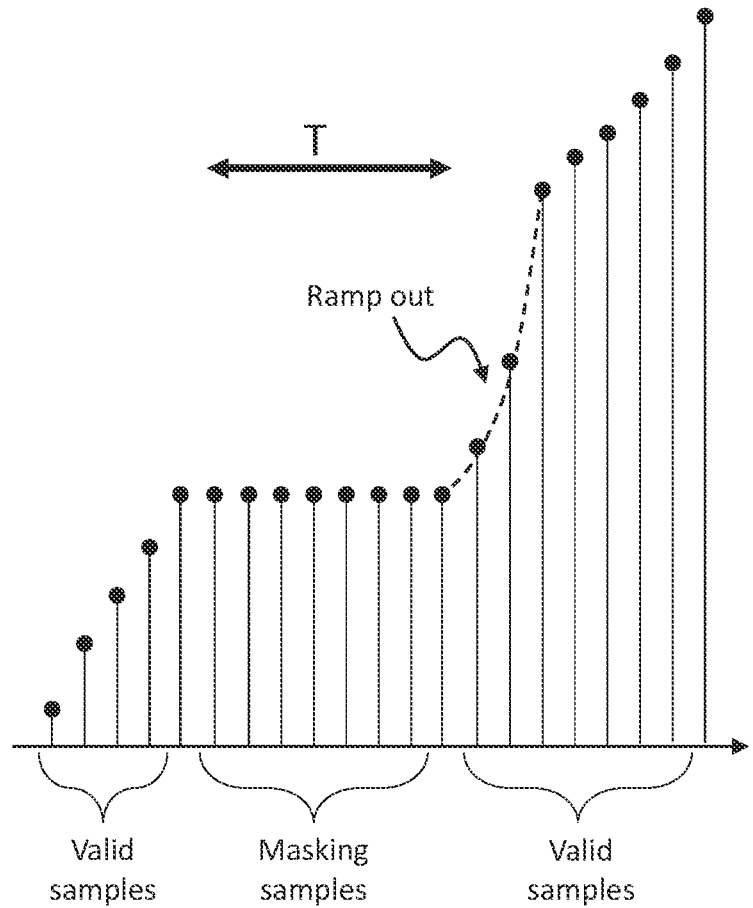

FIG. 16 is a graphical illustration of ramping out or smoothing out of the transition between the masking signal and the valid samples following the masking signal, which reduces the discontinuity associated with a sudden release of the hold shown in FIG. 14. As with the ramp in, the ramp out is preferably non-linear. Such a nonlinear ramp may tend over time towards an amplitude of a valid sample following the masking signal, which results in a smoother signal when compared to a masking signal which is hold at a fixed amplitude before transitioning abruptly to the first valid sample.

It will be noted that in the example shown, the ramp out is not conducted on the masking signal itself, but rather on the valid samples following the masking signal. This is due to the fact that the technique shown utilises the amplitude values of the valid samples following the invalid (masked samples) to ensure the roll out (ramp out) transitions smoothly towards the valid signal following the masking signal.

An example technique for performing the ramp out shown in FIG. 16 will now be described. After the last masking sample, a set of transition samples may replace the valid samples following the masking signal. An amplitude of each transition sample may be calculated as the sum of the amplitude of the previous transition sample and the difference between the previous transition sample and the previous valid sample which has been replaced by the previous transition signal. For example:

$$A_T = A_{TP} + (A_{VP} - A_{TP}) * F$$

where $A_T$ is the current transition sample amplitude, $A_{TP}$ is the previous transition sample amplitude, and $A_{VP}$ is the previous valid sample amplitude (i.e. the amplitude of the sample which was replaced by the previous transition sample). F is a factor which may change its value (e.g., increase or decrease) for each successive transition sample to achieve the desired non-linear ramp of the transition samples, as shown in FIG. 16.

It will be appreciated that in this implementation, the amplitude of the first transition sample will be a weighted average of the amplitude of the last masking sample and the last actual (non-valid/transient) sample. Accordingly, if the final sample masked by the masking signal is substantially distorted, it may be preferable to hold for a further sample in order to remove the effect of such distortion in the transition/ramp out.

It will be appreciated that the above ramp in and ramp out techniques may be implemented in combination to achieve both ramp in and ramp out in the sample output signal.

A drawback of the above strategy is that the amplitude of the first valid sample after the masking sample is not known. As such, any ramping performed during masking may be in a different direction to that of the actual (non-distorted) signal. The above technique may in some implementations lead to unforeseen discontinuities.

In a further example masking technique, a lookahead strategy may be employed. For example, the input signal may be delayed by a predetermined number of samples, so that the amplitude of the first sample after the transient is known and taken into account when calculating the masking signal. In some embodiments, the signal may be delayed by more samples than the hold duration, for example one more sample than the hold durations or <holdduration+1> samples. By looking ahead, various masking signals may be generated.

Figure 17:
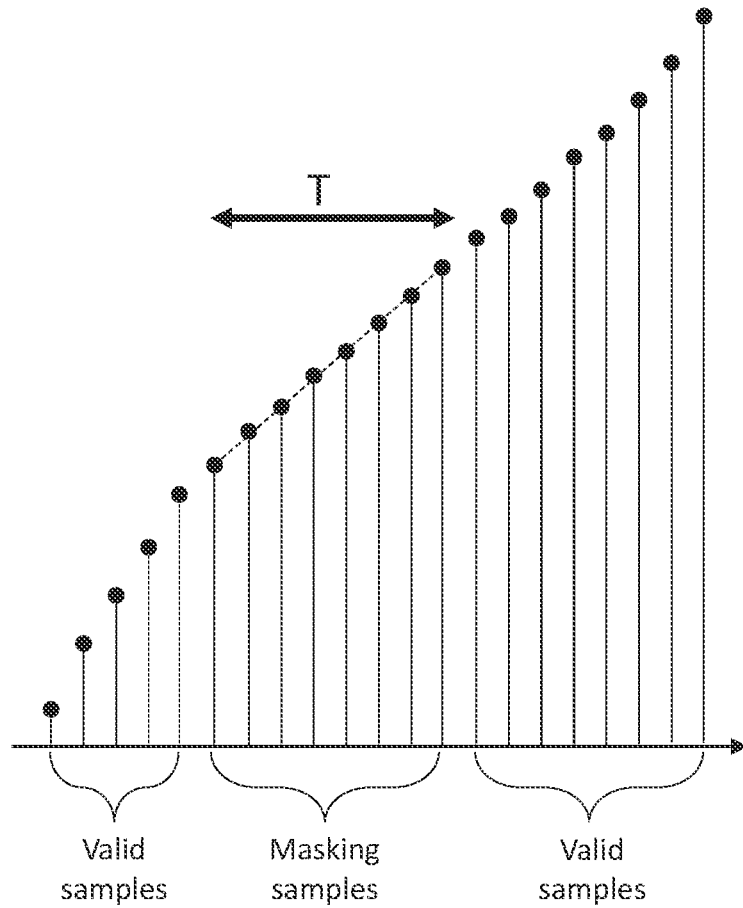

In a first example, linear interpolation may be used to generate a linear ramp between the last valid sample preceding the transient and the first valid sample following the transient, as shown in FIG. 17. When combined with the zero-crossing technique described above, this solution provides excellent performance, significantly reducing the need for signal level detection when applying masking. Thus, masking using this technique can be implemented substantially independent on signal level.

It will be appreciated that in practice it is unusual for an audio signal to take the shape of a linear ramp and such shapes may lead to signal distortion.

Figure 18:
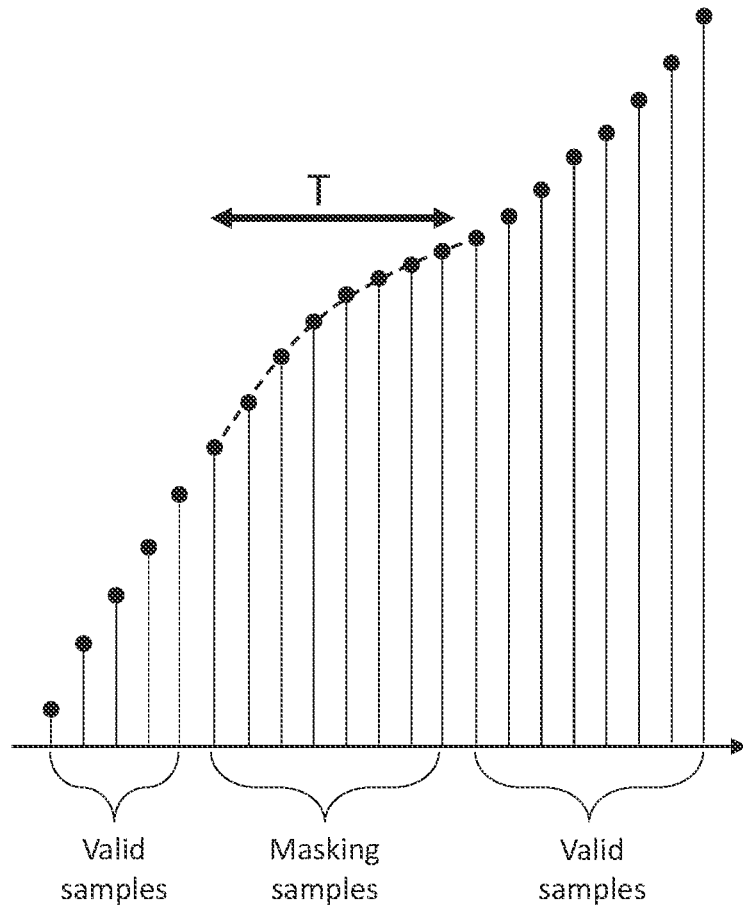

To avoid this and improve performance (at the expense of complexity, processing power and cost), non-linear interpolation may be used to generate a non-linear ramp between the last valid sample preceding the transient and the first valid sample following the transient. FIG. 18 shows an example non-linear interpolation.

Non-linear interpolation may be achieved in a variety of ways.

For example, higher-order interpolation may be employed using groups of valid samples preceding and following the masking sample.

In another example, the ramp in and ramp out techniques described may be employed. However, a more accurate masking signal may be achieved since both the start and end points of the ramp in and ramp out will be known. In this example, the ramp out may commence and complete during the masking period T itself, rather than extending into the valid sample following the masking samples.

In yet a further example, n samples preceding the application of the mask may be stored in memory and a signal pattern determined based on the n samples. Looking ahead, the amplitude of the first valid sample after the masking period may be determined. The first masking sample amplitude may be calculated based on the pattern of n samples and the first valid ample amplitude. A continual look ahead may then be employed to look ahead at the same number of samples. The second mask sample may then be calculated based on the signal pattern of n samples before the mask and the pattern of n valid samples after the mask.

In yet a further example, an approach may be to look ahead to more than one valid sample following the masking signal and estimate a signal pattern during the masking. Such estimation will likely be more accurate (with the knowledge of the delta between valid samples following the masking signal). However, the further ahead one looks, the greater the delay of implementation.

Any or all of the masking techniques described above may be implemented in combination with the hybrid gain control systems 300, 800 described above. In particular, masking methods described herein may be implemented to remove or reduce any discontinuities associated with time misalignment of gain switching in multi-gain-stage systems.

Embodiments of masking described above have been described with reference to a single channel. It will, however, be appreciated that in practice many audio signals and system employ multiple channels.

When processing multiple channels a one-channel-at-a-time technique may be employed in which any of the above masking techniques are implemented asynchronously on each channel. As described above, embodiments of the present disclosure aim to mask transients caused by gain updates (e.g., switching in the gain stages 806, 322). Such gain updates in each channel are preferably zero-cross aligned so as to minimize audibility of such transients. An advantageous effect of this is that it is unlikely for gain changes (and therefore transients) in one channel to be coincident in time with gain changes (and therefore transients) in another channel. In view of this, channels can be updated one at a time. A benefit of this strategy is that as channels are updated, any distortion introduced by masking of transients occurs only in a single channel at a time while the other channels are not being distorted. As such, distortion introduced by masking in one channels may be less audible due to perceptual auditory masking of artefacts associated with the masking by the other channels. This may be particularly applicable where multiple channels comprise correlated content (e.g., stereo signals, multi-microphone arrangements). In addition, hardware implementation is more computationally efficient by sequentially processing each channel, since respective processing power can be reused for each channel, avoiding duplication.

In another example, all channels may be processed in parallel. It will be appreciated that such processing would be faster at the detriment of processing power and cost.

In another example, only one channel may be monitored, and a single masking signal may be generated and applied to all channels based on that one monitored channel.

In a further example which again may be particularly applicable where multiple channels comprise correlated content (e.g., stereo signals, multi-microphone arrangements), the last n samples of a first channel may be used to mimic a second channel to mask a transient in the second channel.

Figure 19:
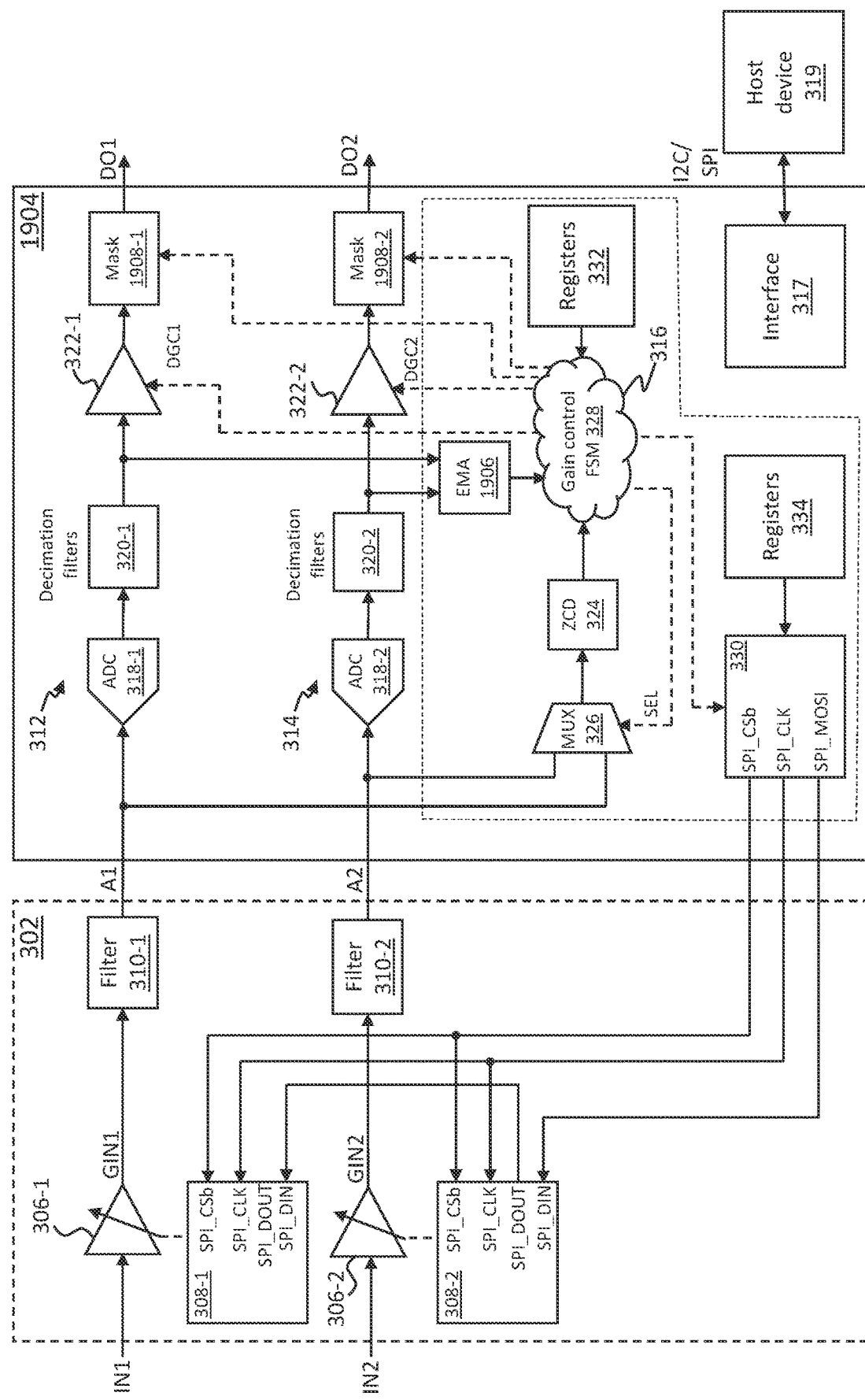
FIG. 19 is a schematic diagram of a gain control regime which may be implemented by the gain control system.

FIG. 19 is a schematic diagram of an example two-channel hybrid gain control system 1900 according to embodiments of the present disclosure. The control system 1900 is a variation of the system 300 shown in FIG. 3, like parts having been given like numbering. The control system 1900 is configured to implement transient masking with signal level thresholding, as will be explained in more detail below.

Like the control system 300 of FIG. 3, the control system 800 comprises the analog gain circuitry 302 and a converter IC 1904. The converter IC 1904 differs from the converter IC 300 of FIG. 3 in that the converter IC 1904 further comprises an exponential moving average (EMA) level detector 1906, and first and second masking modules 1908-1, 1908-2.

The first and second masking modules 1908-1 are provided in respective first and second signal paths 312, 314. The first masking module 1908-1 is coupled between the output of the first digital gain stage 322-1 and the output of the first signal chain 312. The second masking module 1908-2 is coupled between the output of the second digital gain stage 322-2 and the output of the second signal chain 314. Each of the first and second masking modules 1908-1, 1908-2 may be configured to perform any one of the masking techniques described above with reference to FIGS. 14 to 18.

Outputs of the first and second decimators 320-1, 320-2 are provided to the EMA level detector 1906, which is configured to determine an exponential moving average signal level of each of the signals output from the first and second decimators 320-1, 320-2. In other embodiments, the EMA level detector 1906 may be replaced with a module configured to estimate perceived signal level in any conceivable manner (such as RMS level detection).

Such EMA signal levels are output to the FSM 328. The FSM 328 is configured to output one or more control signals to each of the masking modules 1908-1, 1908-2 based on one or more of the EMA signal level(s) provided from the EMA level detector 1906 and the ZCD module 324. As noted above, masking may be triggered, for example, at a zero-crossing event in the input signal. In some embodiments, masking may be implemented only when the perceived signal level is below a threshold. As such, the FSM 328 may control the masking modules 1908-1, 1908-2 to trigger masking based on a zero-crossing event and optionally a determination that a perceived signal level is within a threshold range of below a threshold level. A trigger signal to indicate when transient masking is to be implemented may be generated based on the timing of an event causing the transient (for example using the combination of zero-cross detection and a known signal chain delay), or by detecting the transient. Optionally, one or more condition detectors may be used to enable and/or disable transient masking, or to alter one or more parameters of the transient masking. Any such transient masking may be optimised for signal conditions.

Note that as used herein the term module shall be used to refer to a functional unit or block which may be implemented at least partly by dedicated hardware components such as custom defined circuitry and/or at least partly be implemented by one or more software processors or appropriate code running on a suitable general-purpose processor or the like. A module may itself comprise other modules or functional units. A module may be provided by multiple components or sub-modules which need not be co-located and could be provided on different integrated circuits and/or running on different processors.

Embodiments may be implemented in a host device, especially a portable and/or battery powered host device such as a mobile computing device for example a laptop or tablet computer, a games console, a remote-control device, a home automation controller or a domestic appliance including a domestic temperature or lighting control system, a toy, a machine such as a robot, an audio player, a video player, or a mobile telephone for example a smartphone, a mixing device or console (such as an audio mixing device or audio mixing console), an audio recording device, a paging station, an audio input device for use with a computer, a musical instrument, an audio effects processor, an audio surveillance device, a voice capture device, an audio broadcast device, a sound reinforcement device, a wireless electrical musical instrument interface, a wireless microphone, a microphone with digital output, an ultrasound sensing device, an ultrasound recording device, or a sonar device.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages.

Additionally, other technical advantages may become readily apparent to one of ordinary skill in the art after review of the foregoing figures and description.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. An integrated circuit (IC), comprising:
a first input pin for receiving a first input signal;
a first converter configured to convert the first input signal to a first output signal;
a first gain stage configured to apply a first gain to the first output signal to generate a first amplified output signal;
a second input pin for receiving a second input signal;
a second converter configured to convert the second input signal to a second output signal;
a second gain stage configured to apply a second gain to the second output signal; and
gain update circuitry configured to:
   output a first external gain control signal to a first output pin of the IC;
   subsequent to outputting the first external gain control signal, output a first internal gain control signal to the first gain stage to update the first gain of the first gain stage, wherein output of the first internal gain control signal is delayed relative to output of the first external gain control signal by a first predetermined delay, the first predetermined delay to compensate for signal chain delay between the first input pin and the first gain stage;
   output a second external gain control signal; and
   subsequent to outputting the second external gain control signal, output a second internal gain control signal to the second gain stage to update the second gain of the second gain stage, wherein output of the second internal gain control signal is delayed relative to output of the second external gain control signal by a second predetermined delay, the second predetermined delay to compensate for signal chain delay between the second input pin and the second gain stage.

2. The IC of claim 1, wherein the gain update circuitry is further configured to:

monitor the first input signal or the first output signal for a signal event at which to update the first gain of the first gain stage; and time-align output of the first internal gain control signal to temporally coincide with the signal event reaching the first gain stage.

3. The IC of claim 2, wherein the signal event comprises a zero-crossing of the first input signal or the first output signal, wherein the gain update circuitry comprises zero-cross detection circuitry configured to monitor the first input signal or the first output signal for the zero-crossing.

4. The IC of claim 1, wherein the gain update circuitry is configured to:

receive a first signal event flag at a signal event input pin of the IC; and time output of the internal gain control signal based on a time at which the signal event flag is received.

5. The IC of claim 4, wherein the first signal event flag signifies a zero-crossing in the first input signal.

6. The IC of claim 4, wherein the gain updated circuitry comprises level detection circuitry configured to process the received first signal event flag.

7. The IC of claim 1, further comprising filter circuitry provided between the first input pin and the converter, the filter circuitry configured to filter the first input signal to be provided to the converter, wherein the filter circuitry contributes to the signal chain delay.

8. The IC of claim 1, further comprising:

an interface for receiving first gain settings from a host device;

one or more registers for storing the first gain settings, wherein the gain update circuitry is configured to:

read the first gain settings from the one or more registers; and generate the first external gain control signal and/or the first internal gain control signal based on the first gain settings.

9. The IC of claim 8, wherein the first gain setting comprise a first external gain setting and a first internal gain setting, wherein the first internal and first external gain settings are stored in separate ones of the one or more registers, and wherein the first external and internal gain settings are treated atomically by gain control circuitry.

10. The IC of claim 8, wherein the gain update circuitry is configured to:

determine whether the first gain setting is within a dynamic range of the first gain of the first gain stage;

if the first gain setting is within the dynamic range of the first gain of the first gain stage, update the first internal gain control signal based on the first gain setting;

if the first gain setting is outside the dynamic range of the first gain of the first gain stage, update the first internal gain control signal and the first external gain control signal.

11. A system comprising:

a first analog input for receiving a first analog input signal;

a first analog gain stage configured to apply a first analog gain to the first analog input signal to generate the first input signal; and the IC of claim 1.

12. The system of claim 11, wherein the first analog gain stage comprises a zero-crossing detector configured to detect a zero-crossing event in the analog input signal.

13. The system of claim 11, further comprising external filter circuitry provided between the first analog gain stage and the IC, the external filter circuitry configured to filter the first input signal to be provided to the IC, wherein the filter circuitry contributes to the signal chain delay.

14. The system of claim 11, further comprising:

a synchronization input pin for receiving a plurality of synchronization signals; and a synchronization interface configured to process the plurality of synchronization signals, wherein each of the plurality of synchronization signals comprises a zero-cross detection flag.

15. An electronic device comprising the IC of claim 1.

16. The electronic device according to claim 15, wherein the electronic device comprises a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console, a VR or AR device, a mobile telephone, a portable audio player or other portable device, a mixing console, an audio mixing device, a audio recording device, a paging station, an audio input device for use with a computer, a musical instrument, an audio effects processor, an audio surveillance device, a voice capture device, an audio broadcast device, a sound reinforcement device, a wireless electrical musical instrument interface, a wireless microphone, a microphone with digital output, an ultrasound sensing device, an ultrasound recording device, or a sonar device.

17. A system comprising:

a first analog input for receiving a first analog input signal;

a first analog gain stage configured to apply a first analog gain to the first analog input signal to generate the first input signal;

an integrated circuit (IC), comprising:

a first input pin for receiving the first input signal;

a first converter configured to convert the first input signal to a first output signal;

a first gain stage configured to apply a first gain to the first output signal to generate a first amplified output signal;

gain update circuitry configured to:

output a first external gain control signal to a first output pin of the IC; and subsequently output a first internal gain control signal to the first gain stage to update the first gain of the first gain stage, wherein output of the first internal gain control signal is delayed relative to output of the first external gain control signal by a first predetermined delay, the first predetermined delay to compensate for signal chain delay between the first input pin and the first gain stage; and external filter circuitry provided between the first analog gain stage and the IC, the external filter circuitry configured to filter the first input signal to be provided to the IC, wherein the external filter circuitry contributes to the signal chain delay.

18. A system comprising:

a first analog input for receiving a first analog input signal;

a first analog gain stage configured to apply a first analog gain to the first analog input signal to generate the first input signal;

an integrated circuit (IC), comprising:

a first input pin for receiving the first input signal;

a first converter configured to convert the first input signal to a first output signal;

a first gain stage configured to apply a first gain to the first output signal to generate a first amplified output signal;

gain update circuitry configured to:
- output a first external gain control signal to a first output pin of the IC; and
- subsequently output a first internal gain control signal to the first gain stage to update the first gain of the first gain stage, wherein output of the first internal gain control signal is delayed relative to output of the first external gain control signal by a first predetermined delay, the first predetermined delay to compensate for signal chain delay between the first input pin and the first gain stage;

a synchronization input pin for receiving a plurality of synchronization signals; and a synchronization interface configured to process the plurality of synchronization signals, wherein each of the plurality of synchronization signals comprises a zero-cross detection flag.

* * * * *